(12) United States Patent
Hori et al.

(10) Patent No.: US 9,153,501 B2
(45) Date of Patent: Oct. 6, 2015

(54) METHOD FOR MANUFACTURING SEMICONDUCTOR DEVICE

(75) Inventors: Mitsuaki Hori, Yokohama (JP); Kazutaka Yoshizawa, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 711 days.

(21) Appl. No.: 13/160,460

(22) Filed: Jun. 14, 2011

(65) Prior Publication Data

US 2012/0021593 A1    Jan. 26, 2012

(30) Foreign Application Priority Data

Jul. 22, 2010    (JP) .................................. 2010-165317

(51) Int. Cl.
| | |
|---|---|
| H01L 21/425 | (2006.01) |
| H01L 21/8238 | (2006.01) |
| H01L 21/265 | (2006.01) |
| H01L 21/28 | (2006.01) |
| H01L 21/324 | (2006.01) |
| H01L 29/10 | (2006.01) |
| H01L 29/66 | (2006.01) |
| H01L 29/78 | (2006.01) |

(52) U.S. Cl.
CPC .... *H01L 21/823892* (2013.01); *H01L 21/2652* (2013.01); *H01L 21/28202* (2013.01); *H01L 21/28211* (2013.01); *H01L 21/324* (2013.01); *H01L 21/823807* (2013.01); *H01L 21/823857* (2013.01); *H01L 29/105* (2013.01); *H01L 29/6659* (2013.01); *H01L 29/7843* (2013.01)

(58) Field of Classification Search
None
See application file for complete search history.

(56) References Cited

U.S. PATENT DOCUMENTS

| | | | | |
|---|---|---|---|---|
| 2005/0003597 A1* | 1/2005 | Han et al. | ....................... | 438/197 |
| 2007/0069303 A1* | 3/2007 | Sato et al. | ....................... | 257/369 |
| 2007/0232039 A1* | 10/2007 | Kubo et al. | ................... | 438/527 |
| 2008/0102574 A1* | 5/2008 | Ito | ................................ | 438/231 |
| 2010/0105180 A1* | 4/2010 | Ema et al. | ..................... | 438/264 |

FOREIGN PATENT DOCUMENTS

JP    2004-119860 A    4/2004

OTHER PUBLICATIONS

E, Morifuji et al., "An 1.5 V High Performance Mixed Signal Integration with Indium Channel for 130mm Technology Node", Proceedings of IEDM2000 2000, pp. 459-462.
H, Liao et al., "A Comprehensive Study of Indium Implantation-Induced Damage in Deep Submicrometer nMOSFET: Device Characterization and Damage Assessment", IEEE Transactions on Electron Devices, vol. 49, Dec. 2002, pp. 2254-2262.
J, Wang S. et al., "Enhanced GOI Degradation and Reliability Improvement of Nitrogen and Indium Co-Implant for Advanced Dual-Gate Oxide Application", IEEE 44th Annual International Reliability Physics Symposium (IRPS) 2006, pp. 709-710.

* cited by examiner

*Primary Examiner* — Calvin Choi
(74) *Attorney, Agent, or Firm* — Fujitsu Patent Center

(57) ABSTRACT

A method for manufacturing a semiconductor device includes implanting indium into a first region of a semiconductor substrate; forming a first gate insulation film having a first film thickness in the first region and a second region different from the first region after the implanting; removing the first gate insulation film from the first region; applying heat treatment to the semiconductor substrate after the forming; and forming a second gate insulation film having a second film thickness on the first region after the applying. In the method, a temperature falling rate of the heat treatment in the applying is 20° C. per second or higher.

10 Claims, 26 Drawing Sheets

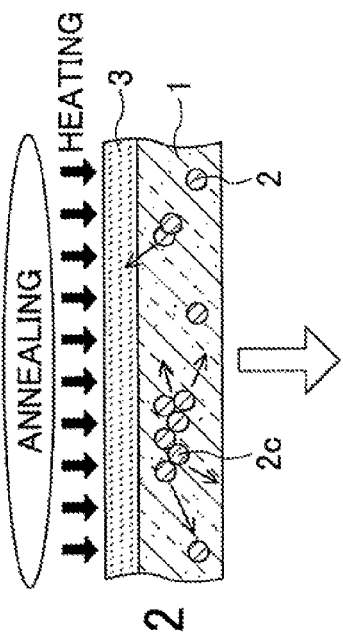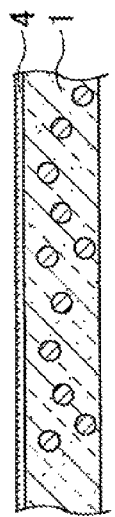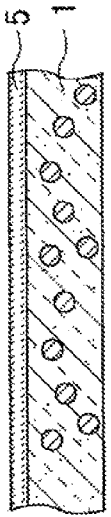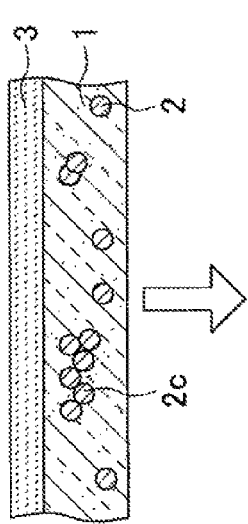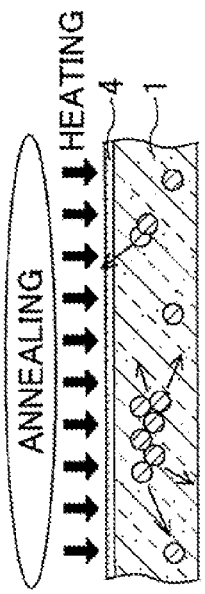

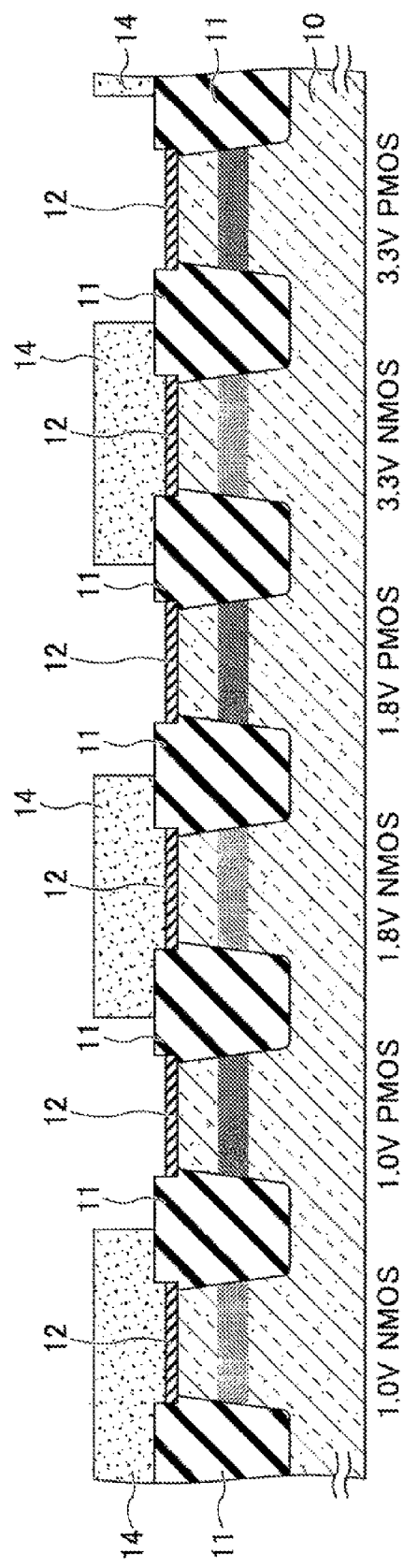
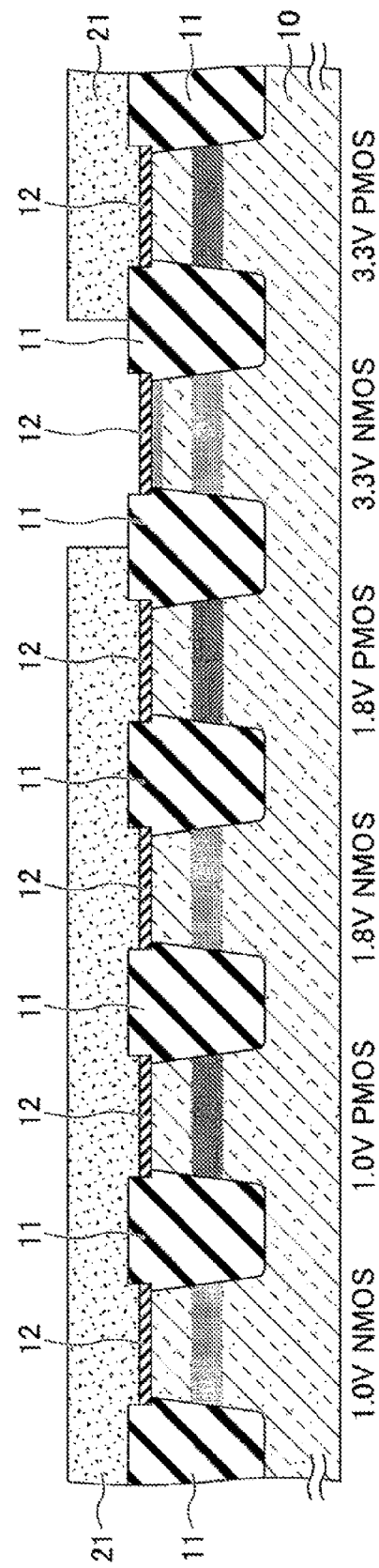

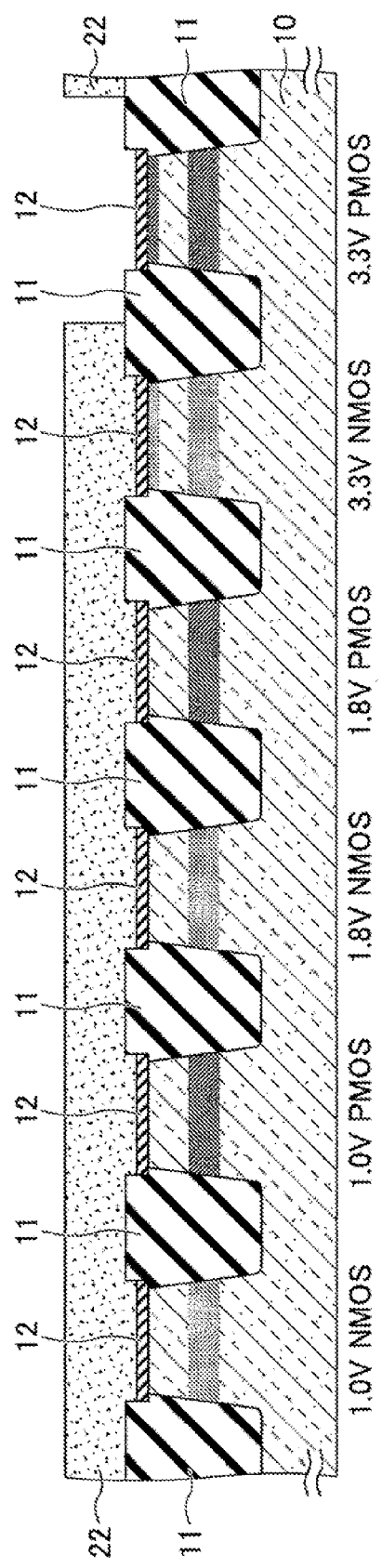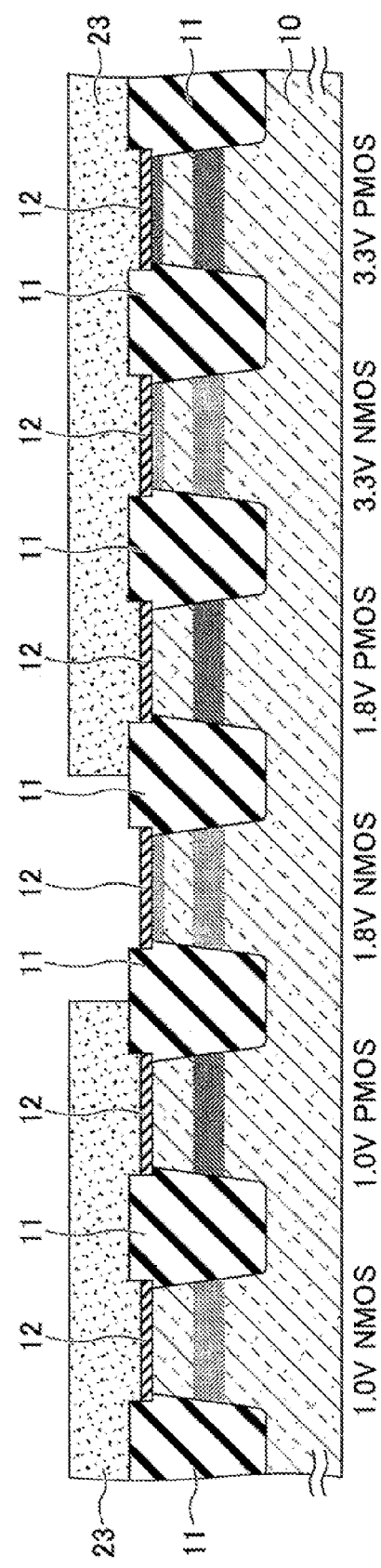

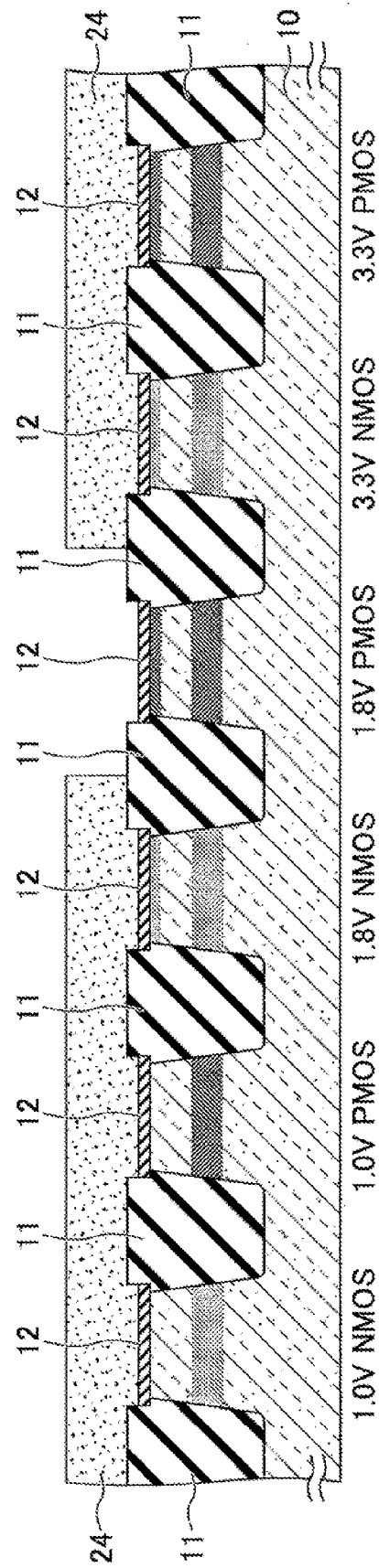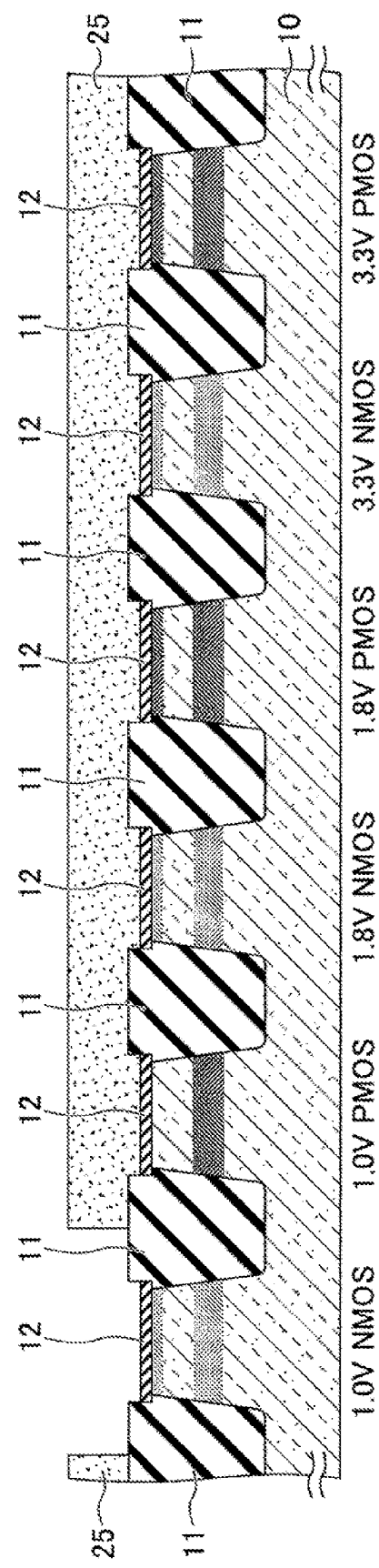

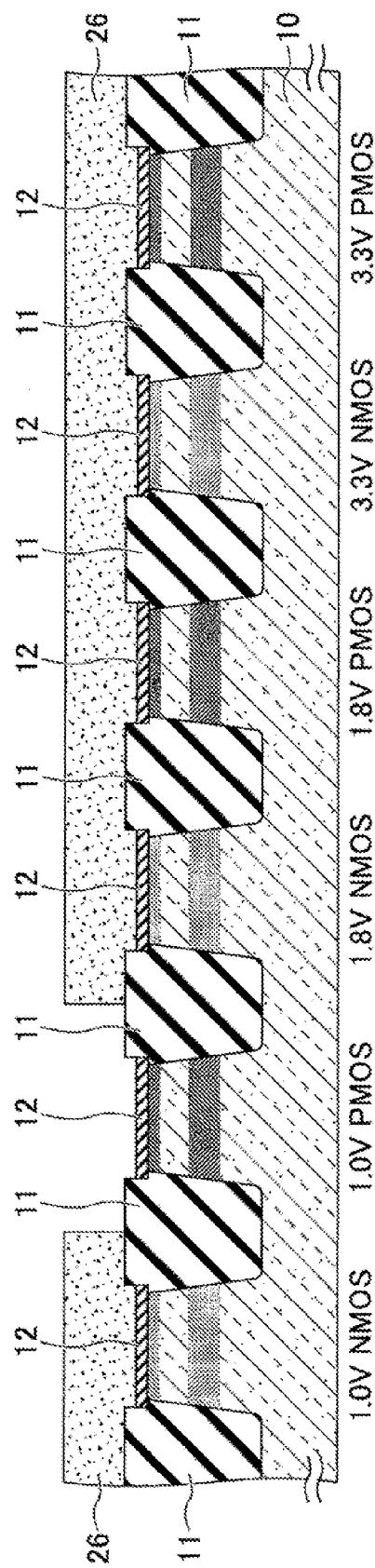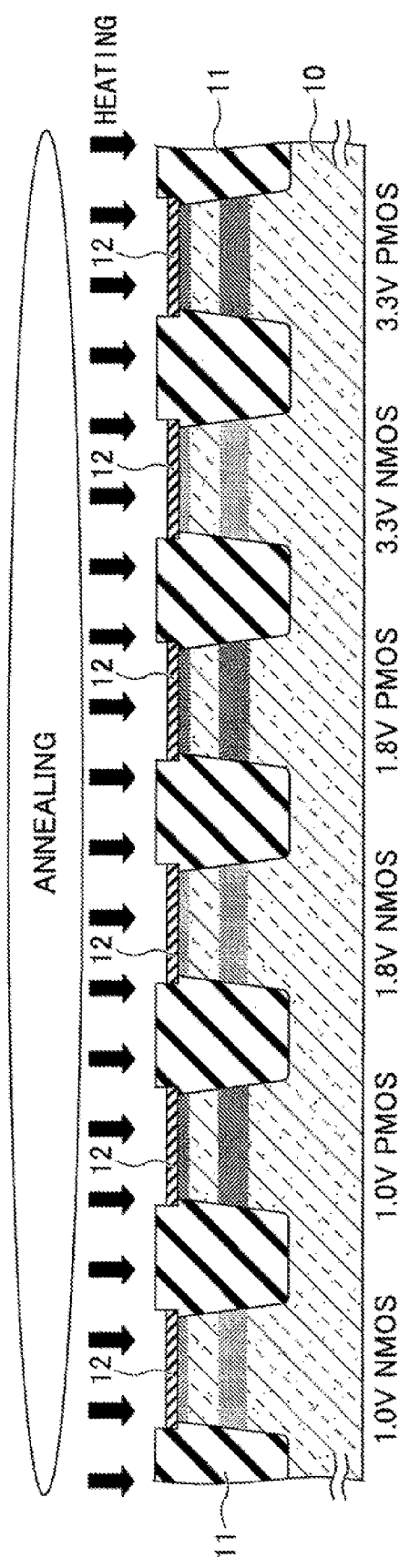

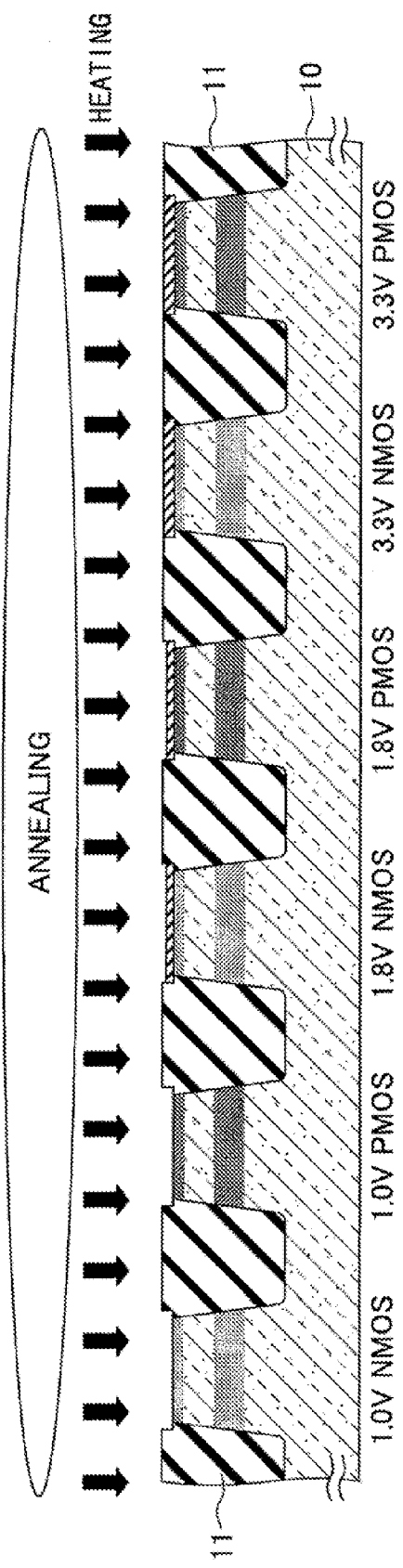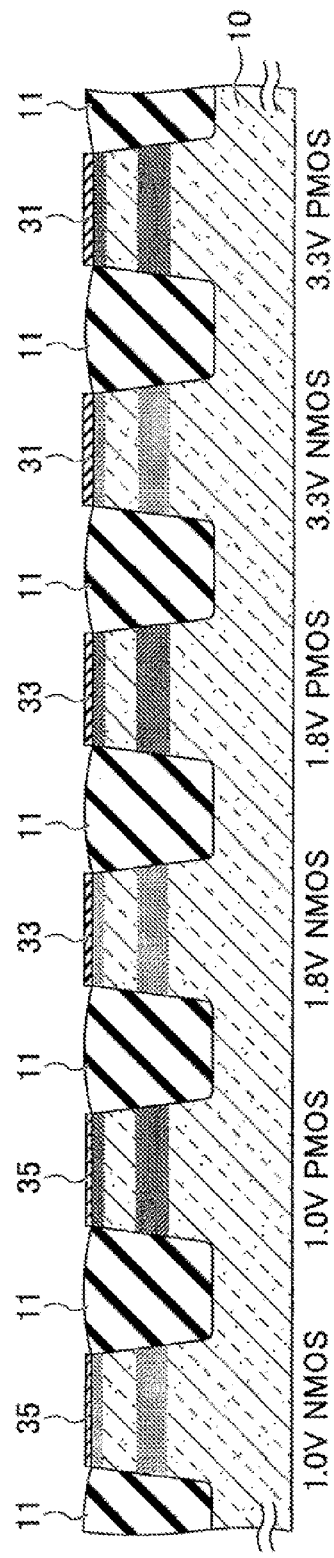

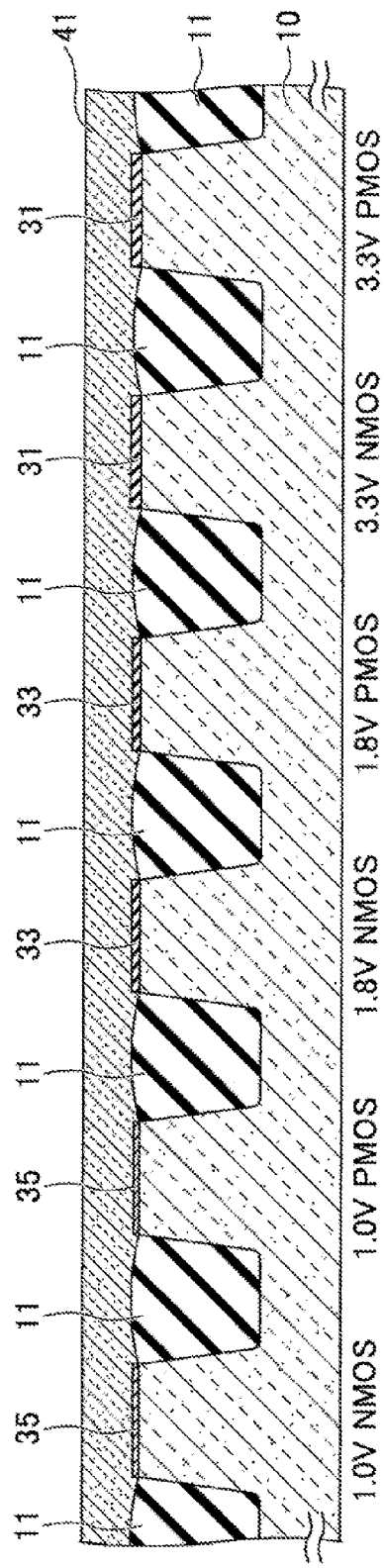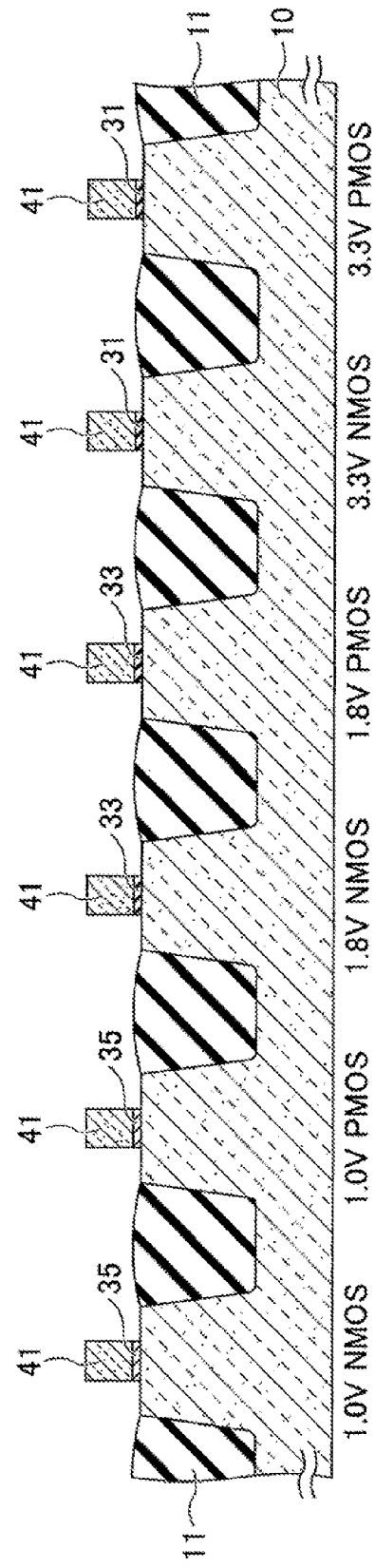

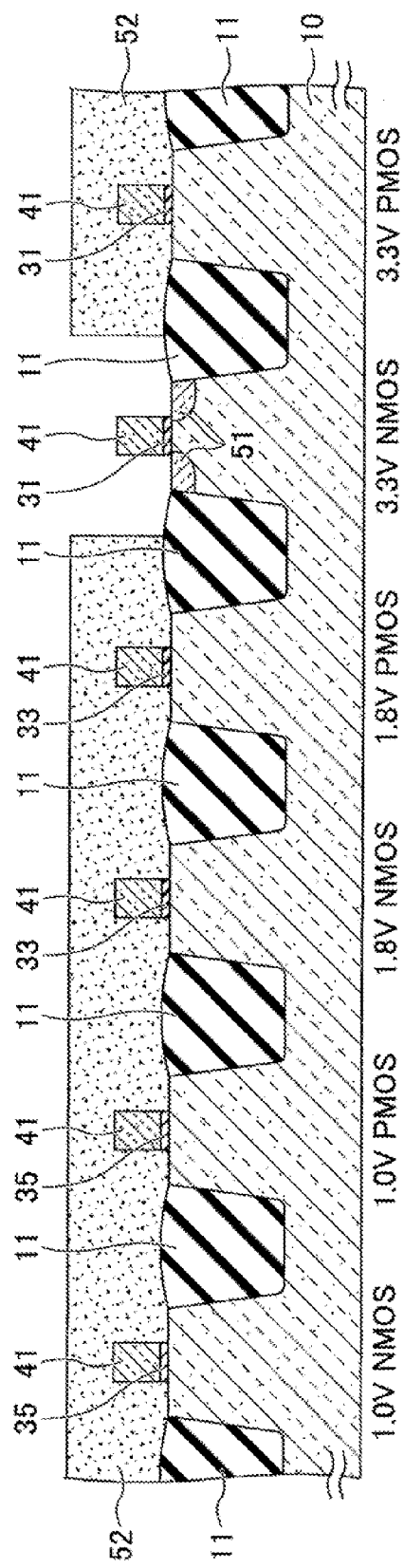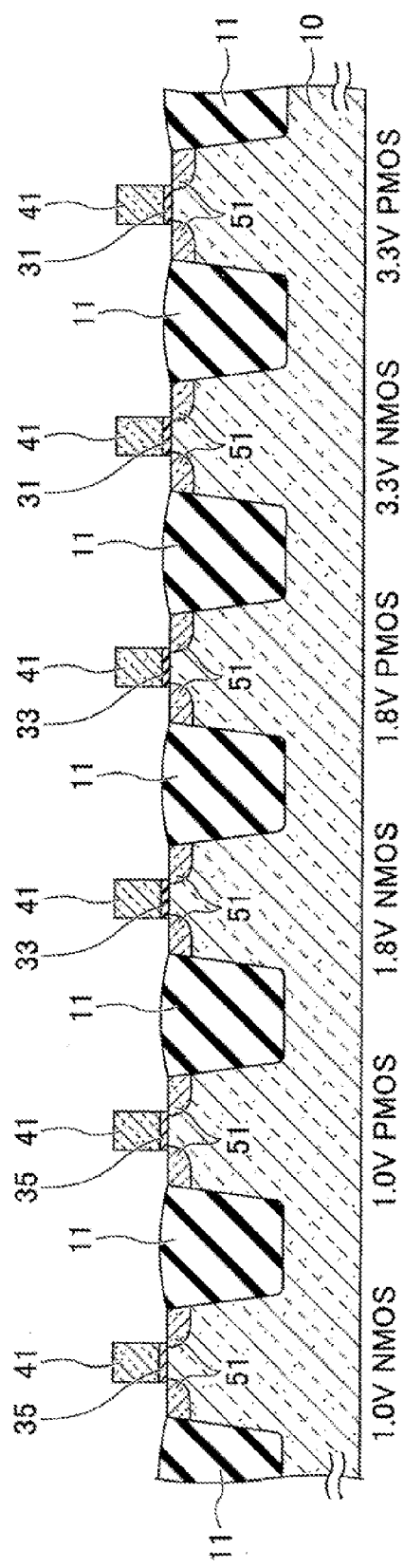

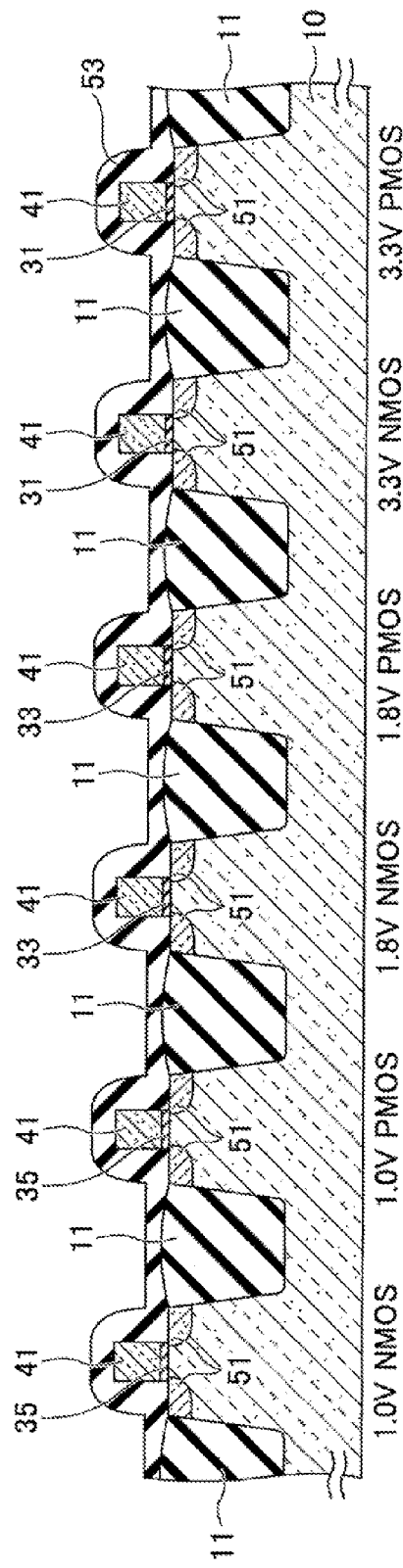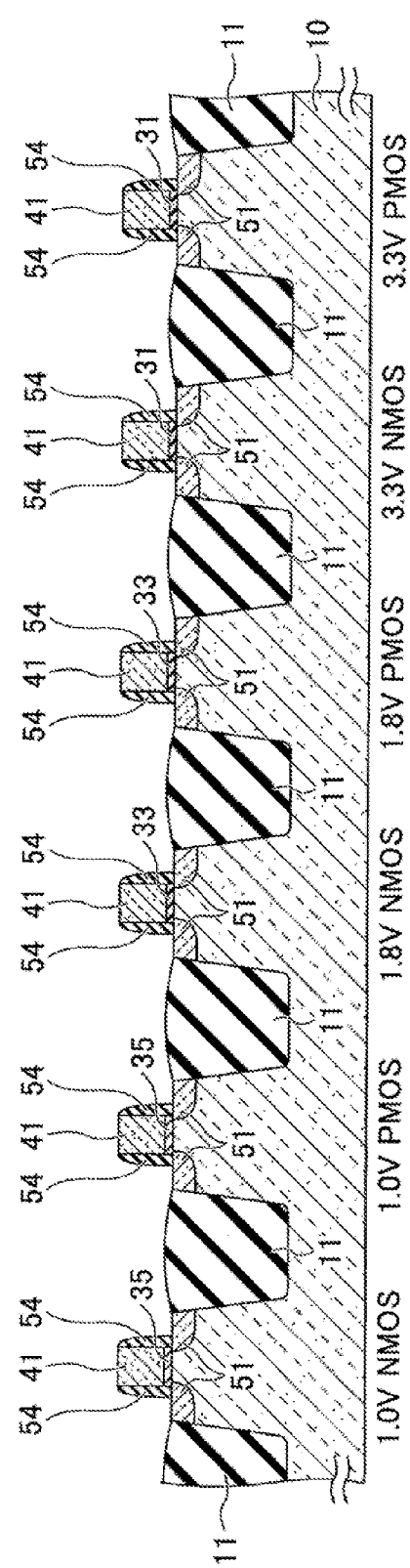

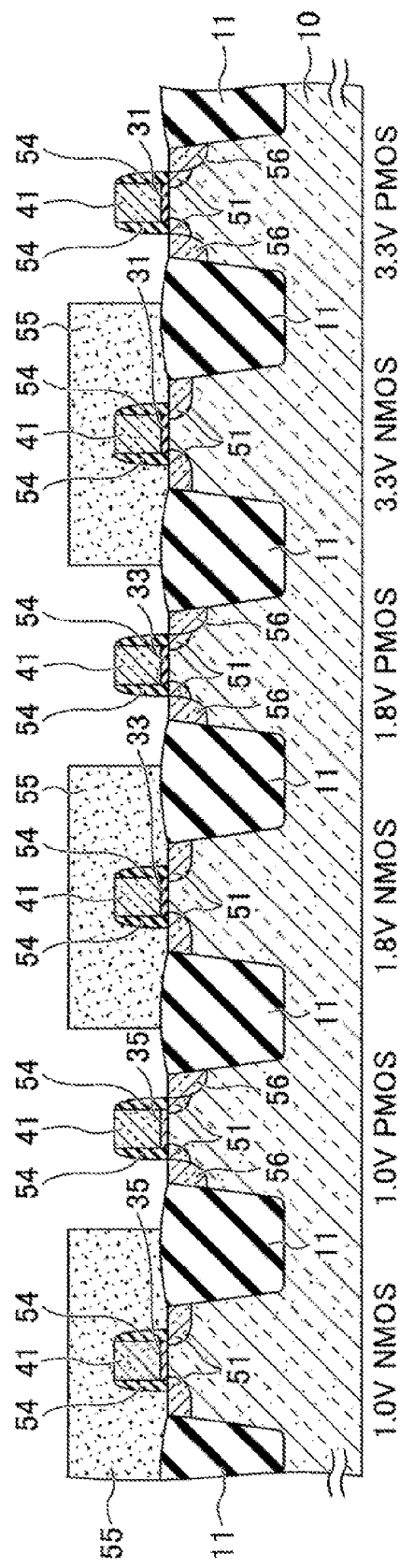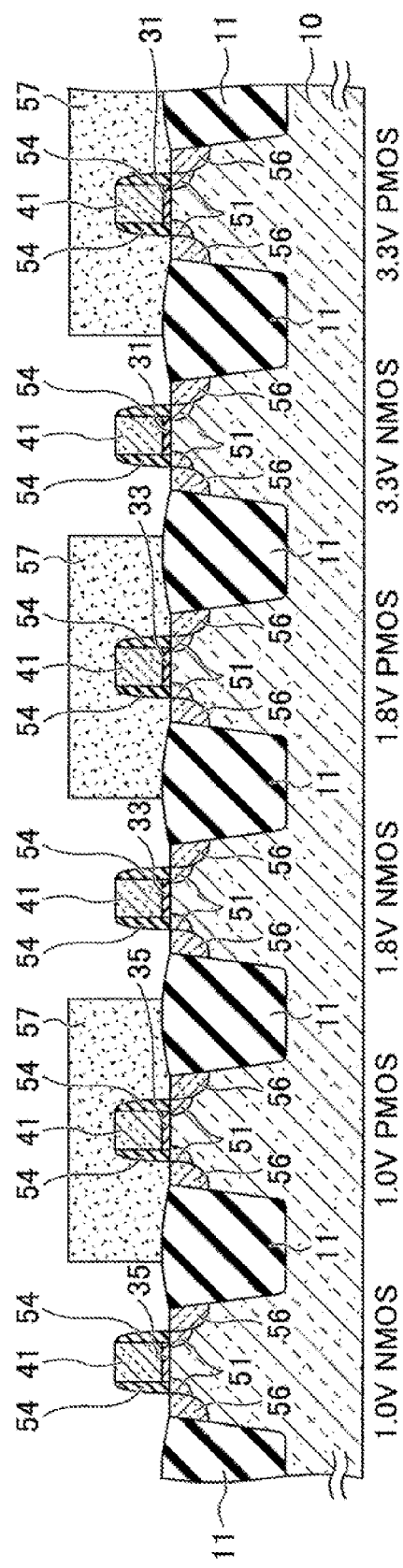

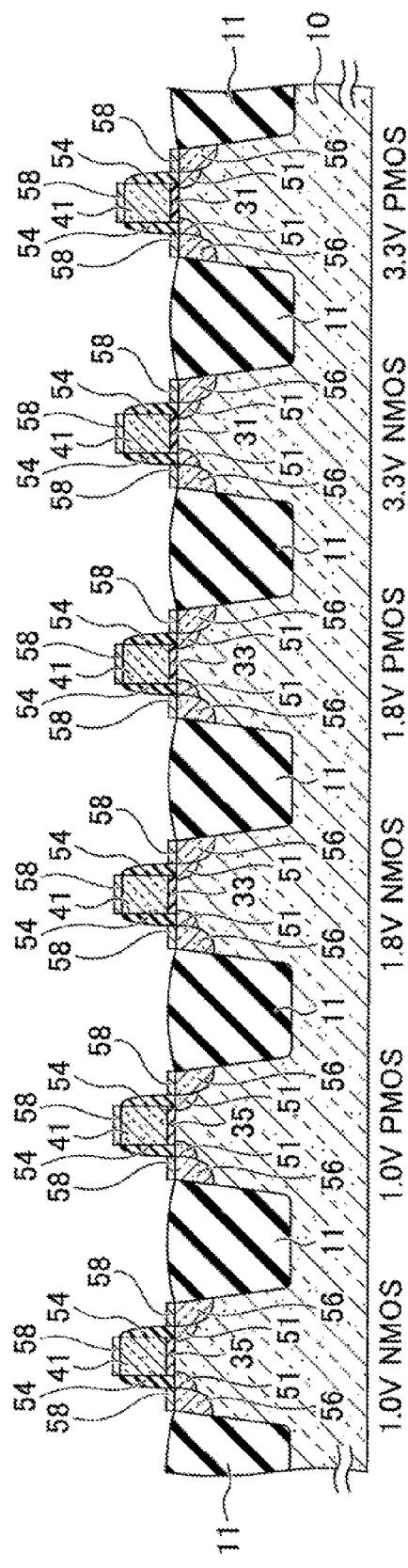
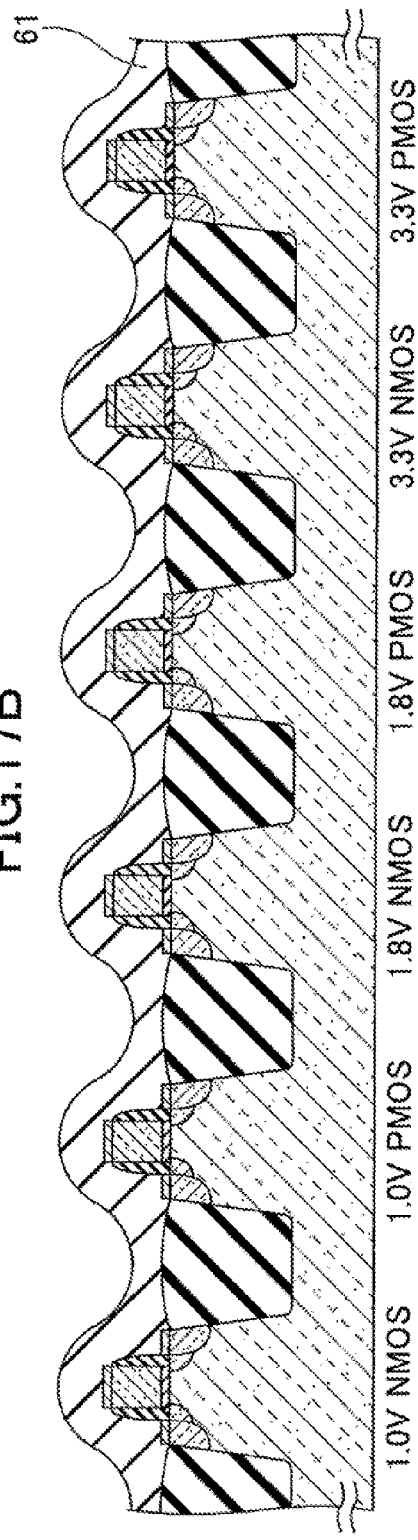

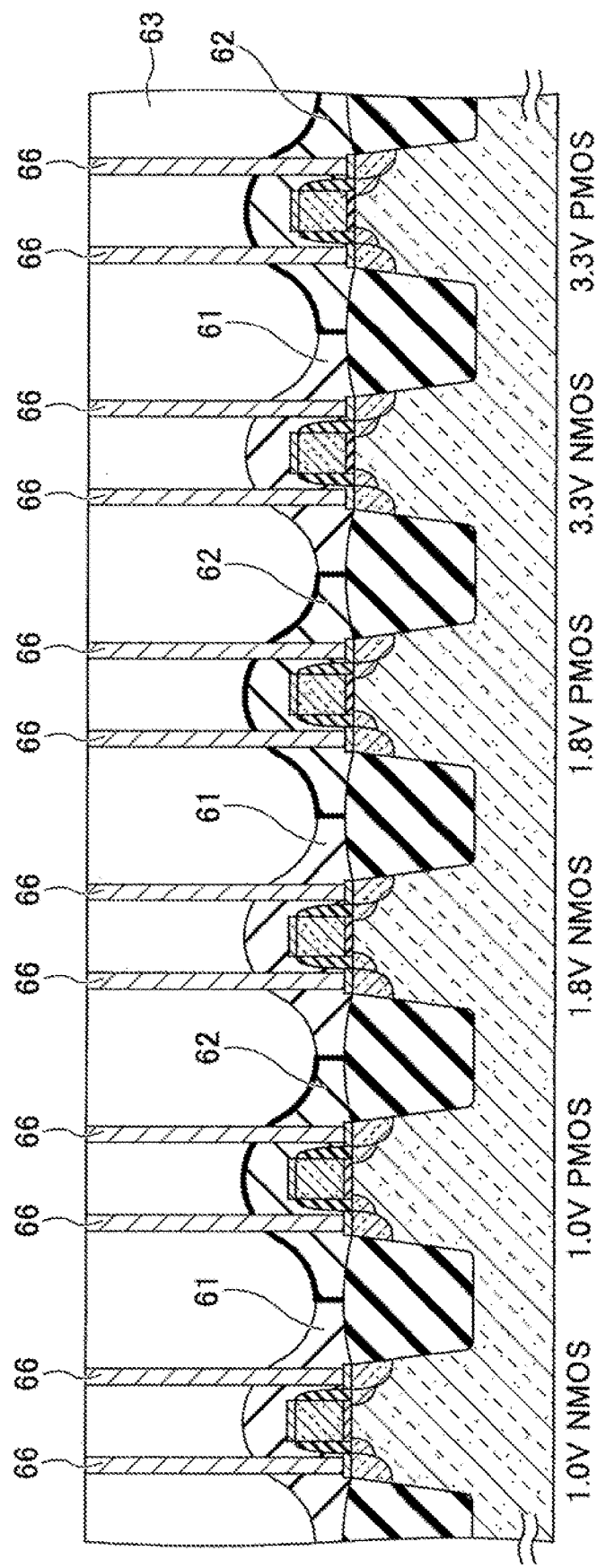

METHOD FOR MANUFACTURING SEMICONDUCTOR DEVICE

CROSS-REFERENCE TO RELATED APPLICATION

This application is based upon and claims the benefit of priority of Japanese Patent Application No. 2010-165317, filed on Jul. 22, 2010, the entire contents of which are incorporated herein by reference.

FIELD

The embodiment discussed herein is related to a method for manufacturing a semiconductor device.

BACKGROUND

With the expansion of functions and performance of semiconductor devices such as ICs (Integrated Circuits) and LSIs (Large-Scale Integrations), transistors included in the semiconductor devices have been made highly integrated and miniaturized. In the miniaturized transistors, it is important to improve the so-called "roll-off characteristics" so that threshold voltages are not fluctuated due to the manufacturing irregularity of gate lengths or the like.

It has been reported that the use of In (indium), which is heavier than B (boron) as a common dopant and less likely to be diffused, improves the roll-off characteristics of n-type MOSFET transistors (hereinafter referred also to as NMOS transistors) at channel implantation for regulating threshold voltages. On the other hand, it has also been known that the implantation of In at a dose of $1 \times 10^{13}$ cm$^{-2}$ or more into channel regions degrades the withstand pressure and/or reliability of gate insulation films. In order to suppress the degradation of the characteristics of such gate insulation films, it has been proposed that nitrogen ($N_2$) is implanted together with In and rapid temperature rising/falling annealing at a temperature of 1000 through 1100° C. is performed as post-annealing after the implantation.

Further, with the expansion of the functions of the semiconductor devices, plural transistors different in structure are integrated together on single semiconductor chips. For example, the transistors of a core part that performs calculation processing or the like are required to operate at higher speed than the transistors of peripheral circuits such as an input/output (I/O) part. Therefore, the high-speed transistors of the core part have thinner gate insulation films and are driven with lower voltages than the transistors of the I/O part. Further, in the core part, some of the transistors are designed to have different driving voltages and/or different thicknesses of the gate insulation films. The gate insulation films of such plural transistors are required to be at least partially formed in separate processes.

Therefore, it has been desired to achieve a method for manufacturing a semiconductor device having plural transistors different in structure without degrading the reliability of gate insulation films in In-implanted regions.

Patent Document 1: Japanese Laid-open Patent Publication No. 2004-119860

Non-Patent Document 1: "A 1.5 V High Performance Mixed Signal Integration with Indium Channel for 130 nm Technology Node"

Non-Patent Document 2: "ENHANCED GOI DEGRADATION AND RELIABILITY IMPROVEMENT OF NITROGEN AND INDIUM CO-IMPLANT FOR ADVANCED DUAL-GATE OXIDE APPLICATION"

Non-Patent Document 3: "A comprehensive Study of Indium Implantation-Induced Damage in Deep Submicrometer nMOSFET: Device Characterization and Damage Assessment"

SUMMARY

According to an aspect of the present invention, a method for manufacturing a semiconductor device includes implanting indium into a first region of a semiconductor substrate; forming a first gate insulation film having a first film thickness in the first region and a second region different from the first region after the implanting; removing the first gate insulation film from the first region; applying heat treatment to the semiconductor substrate after the forming; and forming a second gate insulation film having a second film thickness on the first region after the applying. In the method for manufacturing the semiconductor device, a temperature falling rate of the heat treatment in the applying is 20° C. per second or higher.

The object and advantages of the present invention will be realized and attained by means of the elements and combinations particularly pointed out in the claims.

It is to be understood that both the foregoing general description and the following detailed description are exemplary and explanatory and are not restrictive of the present invention, as claimed.

BRIEF DESCRIPTION OF DRAWINGS

FIGS. 7A-1 and 7A-2 through 7C-1 and 7C-2 are cross-sectional views schematically illustrating the mechanism of suppressing the reliability degradation of the gate insulation film;

FIGS. 9A through 9C are cross-sectional views illustrating an example of the method for manufacturing the semiconductor device according to the first embodiment (1);

FIGS. 10A through 10C are cross-sectional views illustrating an example of the method for manufacturing the semiconductor device according to the first embodiment (2);

FIGS. 11A through 11C are cross-sectional views illustrating an example of the method for manufacturing the semiconductor device according to the first embodiment (3));

FIGS. 12A through 12C are cross-sectional views illustrating an example of the method for manufacturing the semiconductor device according to the first embodiment (4);

FIGS. 13A through 13C are cross-sectional views illustrating an example of the method for manufacturing the semiconductor device according to the first embodiment (5);

FIGS. 14A through 14C are cross-sectional views illustrating an example of the method for manufacturing the semiconductor device according to the first embodiment (6);

FIGS. 15A through 15C are cross-sectional views illustrating an example of the method for manufacturing the semiconductor device according to the first embodiment (7);

FIGS. 16A through 16C are cross-sectional views illustrating an example of the method for manufacturing the semiconductor device according to the first embodiment (8);

FIGS. 17A through 17C are cross-sectional views illustrating an example of the method for manufacturing the semiconductor device according to the first embodiment (9);

FIGS. 18A and 18B are cross sectional-views illustrating an example of the method for manufacturing the semiconductor device according to the first embodiment (10);

DESCRIPTION OF EMBODIMENTS

Figure 1:
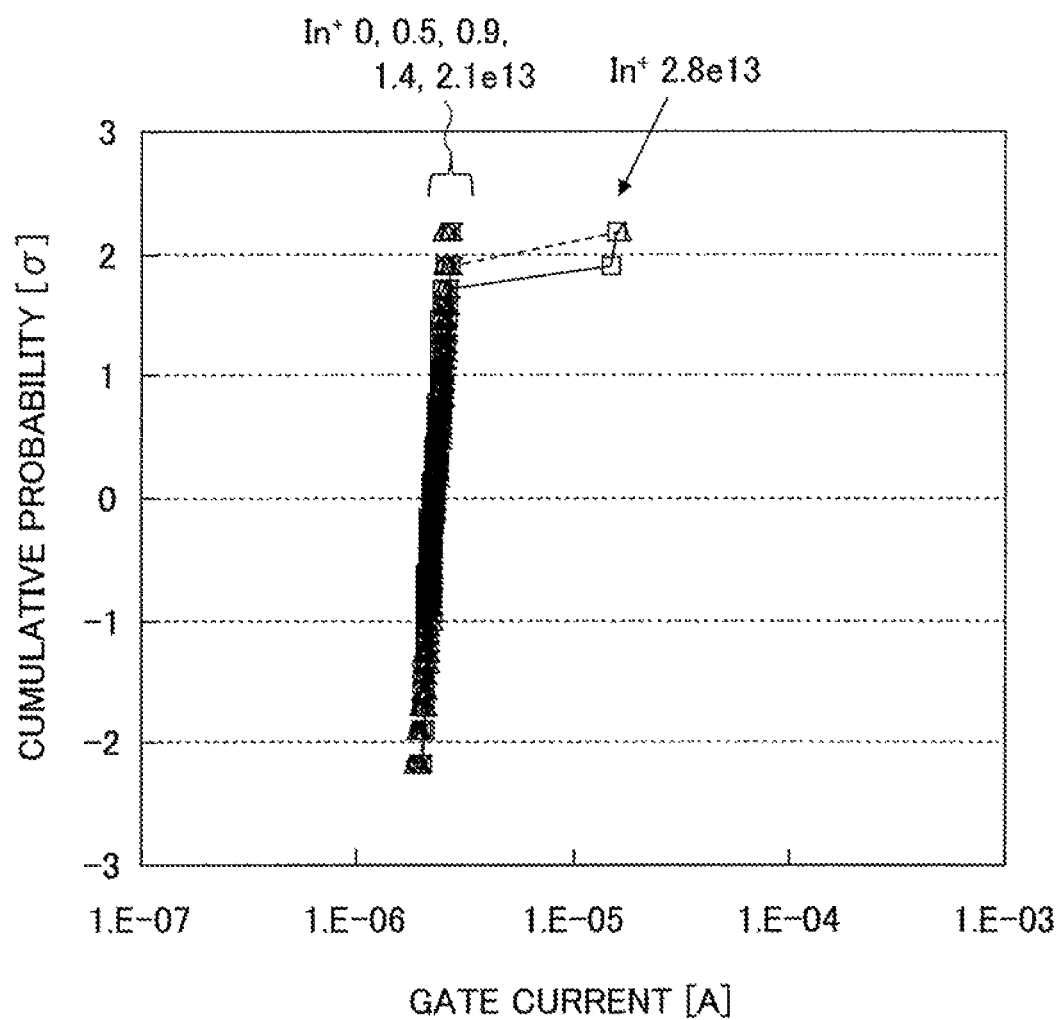
FIG. 1 is a graph illustrating a measurement example of the gate leak distribution of In-implanted NMOS transistors according to a related art.

Hereinafter, embodiments are described in detail with reference to the accompanied drawings. Note that various constituents in the drawings are not necessarily drawn in the same scale.

(First Embodiment)

First, a basic experiment conducted by the inventors of the present invention is described with reference to FIG. 1. In a case where plural transistors having different gate oxide film thicknesses are integrated together, plural oxidation processes for forming the gate insulation films of the respective transistors are performed after completing channel implantation into all the transistors. At this time, it is found that the reliability of the gate oxide films of the In-implanted transistors is degraded even if rapid temperature rising/falling annealing is performed at a temperature of 1000 through 1100° C. as post-annealing after the channel-implantation including In-implantation.

Here, FIG. 1 illustrates a measurement example of the gate leak distribution of In-implanted NMOS transistors. In this example, In-channel implantation into the NMOS transistors of a core part was performed at an acceleration voltage of 40 keV using a dose as a parameter, and boron was implanted into the channel regions of the NMOS transistors of an I/O part. After these channel implantations, rapid rising/falling annealing was performed at 1000° for 10 seconds under an $N_2$ atmosphere. Next, gate oxide films for the transistors of the I/O part were formed in both the core part and the I/O part using a vertical diffusion furnace. Then, after selectively separating the gate oxide films on the core part, the gate insulation films of the transistors of the core part were formed by sequentially performing oxidation treatment with lamp annealing, plasma nitriding treatment, and post-annealing treatment.

As exemplified in FIG. 1, the gate leak characteristics depend on the dose of In, and samples indicating the abnormal values of gate leaks were observed at a dose of $2.8 \times 10^{13}$ $cm^{-2}$. Note that in this example, no abnormal values were observed under the condition in which the dose of In is $2.1 \times 10^{13}$ $cm^{-2}$ or less. However, thresholds of the dose of In possibly causing abnormal values may be changed depending on the implantation energy of In, the method for forming the gate oxide films described above, or the like.

Therefore, it has been desired to achieve a method for manufacturing a semiconductor device having plural transistors, in which gate insulation films are formed in separate processes, without degrading the reliability of the gate insulation films of In-channel-implanted NMOS transistors.

Next, a method for manufacturing a semiconductor device according to a first embodiment is described with reference to FIG. 2. This method includes forming on a common semiconductor substrate one or more NMOS transistors having In implanted into their channel regions for improving the roll-off characteristics and one or more transistors having gate insulation films different from those of the NMOS transistors. Since In implantation into the regions is generally applied to the NMOS transistors having low threshold voltages requested to have high resistance to roll-off, the NMOS transistors may have thinner gate insulation films than transistors having other different gate insulation films. As an example, the NMOS transistors of a core part and the MOSFET transistors of an I/O part having gate insulation films driven with higher voltages and having thicker gate insulation films than the NMOS transistors are formed.

In the following description, for the sake of convenience, the In-implanted NMOS transistors are recognized as the NMOS transistors of the core part and the transistors having gate insulation film thicknesses different from those of the NMOS transistors are recognized as the transistors of the I/O part. Further, the semiconductor device may include other transistors such as the p-type MOSFET transistors (hereinafter referred also to as PMOS transistors) of the core part, but matters related to such transistors are not referred to in the description associated with FIG. 2.

In step S10, an insulation film for isolating the elements is formed on a semiconductor substrate. For element isolation, STI (Shallow Trench Isolation) can, for example, be used. Next, in step S20, ion implantation is performed to form wells in the forming regions of the elements of the core part and the I/O part where the elements are isolated.

Then, in step S30, channel implantation for controlling threshold voltages is performed with respect to the channel regions of the NMOS transistors of the core part and the transistors of the I/O part. In is implanted into the NMOS transistors of the core part, but other dopants such as boron (B) may be additionally implanted into them. If the transistors of the I/O part are p-type transistors, a substance such as P (phosphorous), As (arsenic), or Sb (stibium) is implanted into them. If the transistors of the I/O part are n-type transistors, a substance such as B is implanted into them.

Next, in step S40, the activation annealing of the dopants implanted in steps S20 and S30 is performed in step S40 as occasion demands. The annealing can be performed, for example, at a temperature of 800 through 1050° C. under a nitrogen atmosphere. As an example, using a rapid temperature rising/falling annealing unit, the activation can be made under the condition in which the dopants are annealed at 100° C. for 10 seconds under a nitrogen atmosphere. Note that the activation may be achieved in a subsequent heating process to form gate oxide films.

Then, in step S50, the gate insulation films of the transistors of the I/O part are formed. For example, oxide films having a thickness of 2 through 7 nm are formed by water-vapor or dry oxygen oxidation using a vertical diffusion furnace. Alternatively, the oxide films may be formed under an oxygen atmosphere or an oxygen/hydrogen mixed atmosphere using a rapid temperature rising/falling annealing unit. If the I/O part or other parts include plural types of transistors having different gate insulation film thicknesses, step S50 is repeatedly performed until such gate insulation films are formed. That is, the oxide films having a first film thickness, for example, a thickness of 2 through 7 nm are formed in both a first activation region in which the transistors of the I/O part are formed and a second activation region in which the transistors of the core part are formed. The first insulation films formed in the second activation region are removed.

Next, in step S60, prior to forming the gate insulation films of the NMOS transistors of the core part, heat treatment is performed under an $N_2$, $H_2$, He, or Ar, atmosphere or under an non-oxidizing atmosphere such as a mixed atmosphere of these substances. The heat treatment (hereinafter referred to as pre-annealing or recovery annealing) may preferably be rapid temperature rising/falling annealing at a temperature of 1000 through 1100° C. as described in more detail below.

Also, step S60 includes selectively separating the insulation films formed in the core part in step S50. The pre-annealing may be performed before or after selectively separating the insulation films. In other words, the insulation films formed in the core part in step S50 are removed prior to or after the pre-annealing.

Then, in step S70, the gate insulation films of the NMOS transistors of the core part are formed. For example, gate oxide films having a thickness of 1 through 1.5 nm are formed by oxidation treatment under an $O_2$ atmosphere or a pressure-reduced $O_2$ atmosphere using a rapid temperature rising/falling processing unit. Further, for example, the gate insulation films of an oxynitride film system may be formed in such a manner that the front surfaces of the gate oxide films are subjected to post-annealing after being nitrided by a plasma nitriding method. As another example, the gate oxide films serving as base films may have a high dielectric (high-k) material deposited thereon.

Next, in step S80, gate electrodes are formed by, for example, the deposition of polysilicon and subsequent patterning. Then, after forming source/drain regions, depositing the insulation films, forming contact holes, and forming wiring layers, the semiconductor device is completed.

The pre-annealing in step S60 can improve the reliability of the gate insulation films of the NMOS transistors into which the In-channels are implanted, which is described below with reference to FIGS. 3 and 4.

Figure 2:
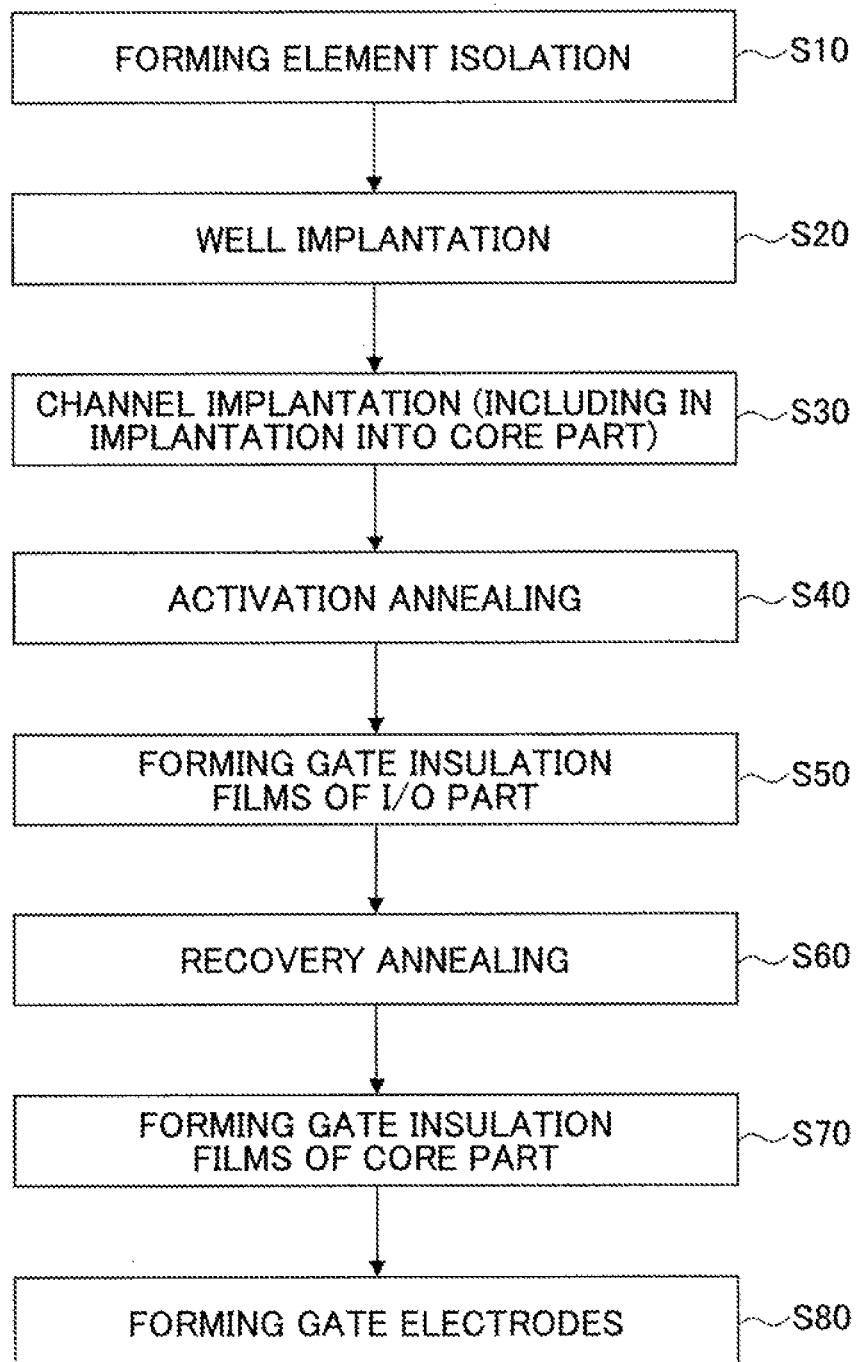
FIG. 2 is a flowchart illustrating a method for manufacturing a semiconductor device according to a first embodiment.
Figure 3:
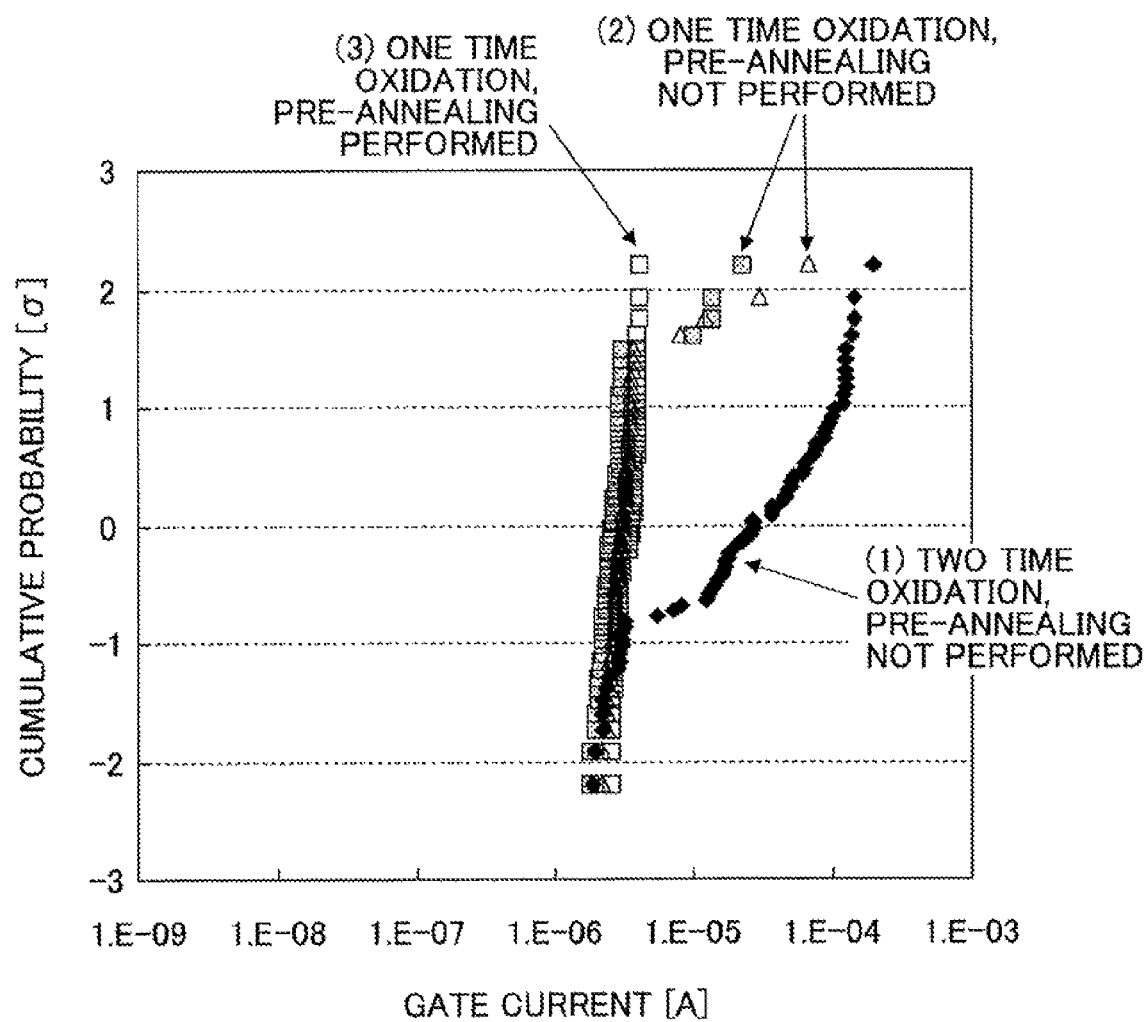
FIG. 3 is a graph illustrating a comparative example of the gate leak distribution based on the presence or absence of pre-annealing.

FIG. 3 illustrates the effects of suppressing the fluctuations of gate leaks by the pre-annealing. In FIG. 3, the evaluation results of samples under three conditions (1) through (3) are illustrated. These conditions are common to all the steps except for steps S50 and S60 in FIG. 2. In was implanted into the regions of the NMOS transistors of the core part at an acceleration voltage of 100 keV and a dose of $2.8 \times 10^{13}$ atm/$cm^2$ in step S30, and the annealing was performed at 1000° C. for 10 seconds under an $N_2$ atmosphere in step S40. Further, in step S70, the oxide films were formed by oxidation treatment at 945° C. under an $O_2$ atmosphere using a rapid temperature rising/falling annealing unit of lamp heating, and then the plasma nitriding treatment and the post-annealing treatment were performed under an NO atmosphere. Thus, as the gate insulation films of the NMOS transistors of the core part, the oxynitride films having a thickness of about 1.7 nm were obtained.

In step S50, as the condition (1), the oxide films having a thickness of 5.0 nm were formed at 800° C. under a water-vapor atmosphere in a vertical diffusion furnace, and the oxide films having a thickness of 2.8 nm were formed at 750° C. under a water vapor atmosphere in the vertical diffusion furnace. As the conditions (2) and (3), the oxide films having a thickness of 6.1 nm were formed at 800° C. under a water-vapor atmosphere in the vertical diffusion furnace. The pre-annealing in step S60 was not performed under the conditions (1) and (2) but performed only under the condition (3). The pre-annealing was performed at 1000° C. for 10 seconds under a hydrogen atmosphere using a rapid temperature rising/falling annealing unit.

As illustrated under the conditions (1) and (2), the samples indicating abnormally large gate leaks were detected where the pre-annealing was not performed. Further, as evident from the fact that the gate leaks rise from about −1σ at the center of distribution under the condition (1), the larger the number of oxidation times (S50) before forming the gate insulation films in the In-implanted regions (S70) was, the more the abnormal samples were detected. Conversely, as illustrated under the condition (3), in a case where rapid temperature rising/falling annealing was performed at 1000° C. for 10 seconds as the pre-annealing in step S60, no samples indicating abnormal values were observed. Note that although not illustrated in FIG. 3, even if a two-time oxidation process was performed in step S50 like the condition (1), it was found that the occurrence of abnormal values was suppressed or inhibited by the above pre-annealing in step S60.

Figure 4A:
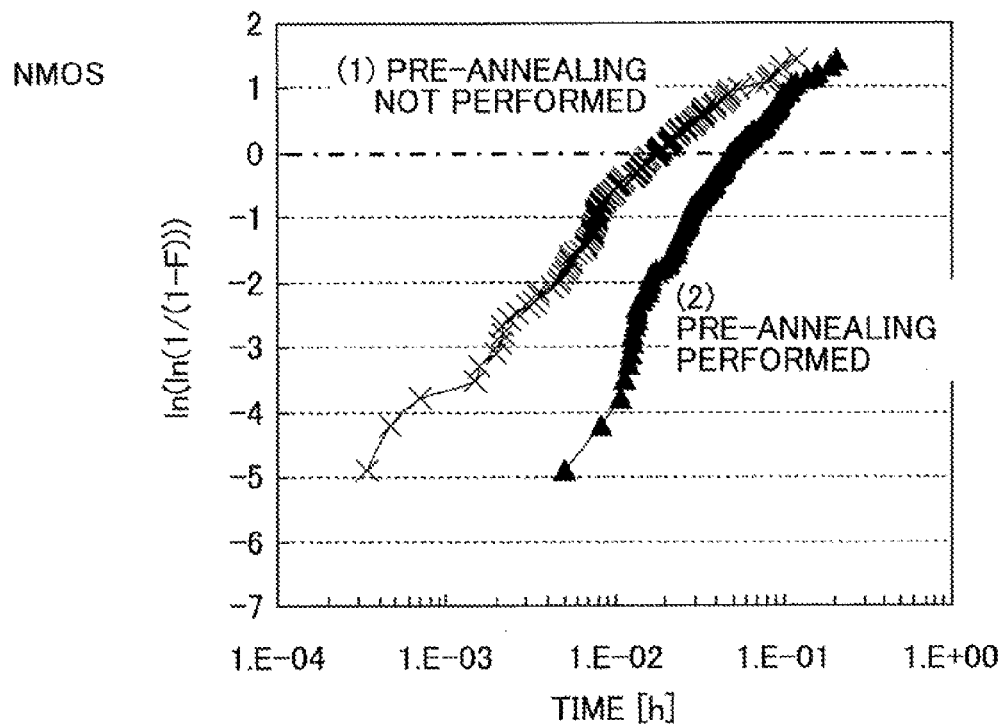
FIGS. 4A and 4B are graphs illustrating an example of TDDB service life based on the presence or absence of the pre-annealing.
Figure 4B:
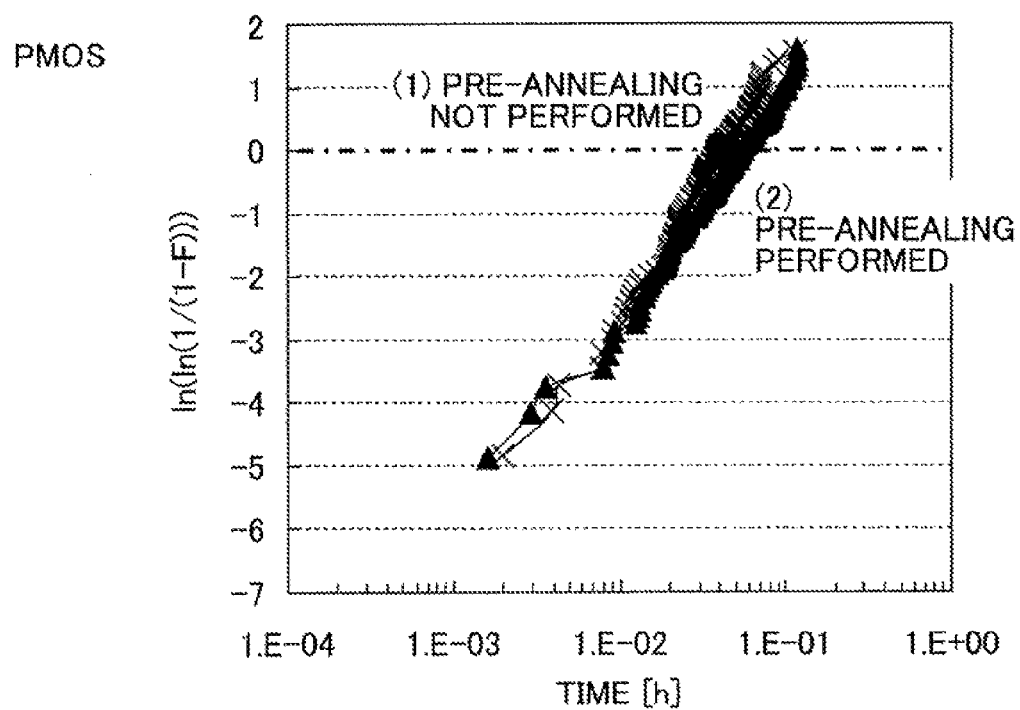

FIGS. 4A and 4B illustrate the TDDB (Time Dependent Dielectric Breakdown) acceleration test results of the NMOS transistors and the PMOS transistors of the core part, respectively, and particularly illustrate the TDDB improvement results of the NMOS transistors by the pre-annealing in step S60. In FIGS. 4A and 4B, the evaluation results of samples under two conditions (1) and (2) are illustrated as the Weibull plots of TDDB cumulative failure rates. These conditions are common to all the steps except for step S60 in FIG. 2. In was implanted into the regions of the NMOS transistors of the core part at an acceleration voltage of 40 keV and a dose of $1.3 \times 10^{13}$ $cm^{-2}$ in step S30, and the annealing was performed at 1000° C. for 10 seconds under an $N_2$ atmosphere in step S40. Further, in step S50, the oxide films having a thickness of 3.2 nm were formed under a water-vapor atmosphere at 750° C. using a vertical diffusion furnace. Further, in step S70, the oxide films were formed by oxidation treatment at 900° C. under a pressure-reduced $O_2$ atmosphere using the rapid temperature rising/falling annealing unit of lamp heating, and then the plasma nitriding treatment and the post-annealing treatment were performed under an NO atmosphere. Thus, as the gate insulation films of the NMOS transistors of the core part, the oxynitride films having a thickness of about 1.3 nm were obtained.

The pre-annealing in step S60 was not performed under the condition (1) but performed only under the condition (2). The pre-annealing was performed at 1000° C. for 10 seconds under a hydrogen atmosphere using a rapid temperature temperature rising/falling annealing unit.

As illustrated in FIG. 4A, (1) in a case where the pre-annealing was not performed, many random failures also called B-mode failures occurring at relatively early time were detected. On the other hand, (2) in a case where the pre-annealing was performed, it was found that the B-mode failures were avoided, a curved line almost following C-mode failures due to withstand pressure unique to the insulation films was obtained, and TDDB service life was remarkably improved.

Further, as illustrated in FIG. 4B, no significant differences depending on the presence or absence of the pre-annealing were observed in the PMOS transistors into which no In was implanted. That is, the pre-annealing does not degrade the reliability of the gate insulation films of the PMOS transistors.

As illustrated in FIGS. 3A, 3B, 4A, and 4B, in a case where the plural transistors having the gate insulation films formed in separate processes are integrated together, the reliability may be degraded if the gate insulation films of the In-implanted NMOS transistors are formed after the oxidation processes of the other transistors. For example, gate leak failures are likely to occur with an increase in the dose of In, and desired TDDB service life may not be obtained even with a relatively a small dose of In. However, if the heat treatment is performed after the oxidation process of the other transistors as the pre-annealing before forming the gate insulation films of the In-implanted NMOS transistors, the degradation of the reliability of the gate insulation films of the NMOS transistors can be suppressed or inhibited. That is, an improvement in the roll-off characteristics with the In-channel implantation can be achieved while ensuring the reliability of the gate insulation films.

The mechanisms of degrading the reliability due to the oxidation process of the other transistors and improving the reliability of the gate insulation films by the pre-annealing have not been thoroughly made clear but may be related to the precipitation of implanted In on the front surface of the semiconductor device, which is described below with reference to FIGS. 5A, 5B, 5C, 6, and 7.

Figure 5A:
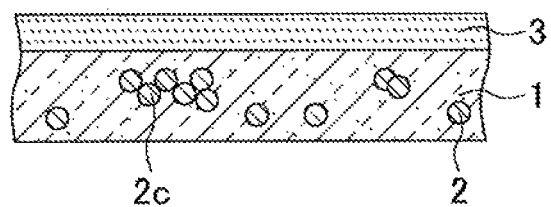
FIGS. 5A through 5C are cross-sectional views illustrating the mechanism of degrading the reliability of a gate insulation film in an In-implanted region.
Figure 5B:
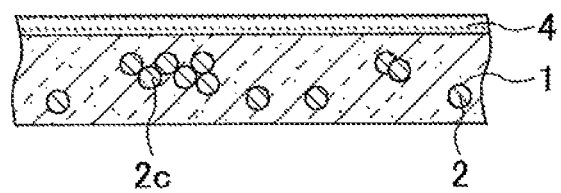
Figure 5C:
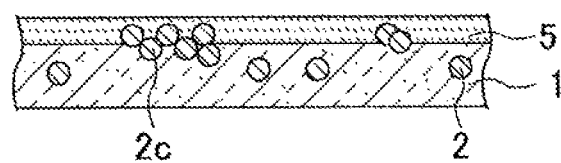

FIGS. 5A through 5C illustrate the mechanism of degrading the gate insulation films in the In-implanted regions. For example, In ions 2 implanted into a semiconductor substrate 1 serving as a silicon (Si) wafer may be precipitated near the front surface of the semiconductor substrate 1 at the ramp-up time and the ramp-down time of the heat treatment for forming gate oxide films 3 of various transistors (FIG. 5A). Further, some of the In ions may form clusters 2c of the In ions. Then, the gate oxide films 3 are separated in the In-implanted regions (for example, in the NMOS transistors of the core part). For example, the gate oxide films 3 are separated by fluorine (HF) treatment, and chemical oxides 4 are formed at the front surface of the semiconductor substrate 1. In this state, the new gate insulation films 5 (of the NMOS transistors of the core part) are formed in the In-implanted regions (FIG. 5C). At this time, the In ions 2 or the clusters 2c of the In ions are taken into the gate insulation films 5, which in turn degrades the reliability of the gate insulation films 5.

Figure 6:
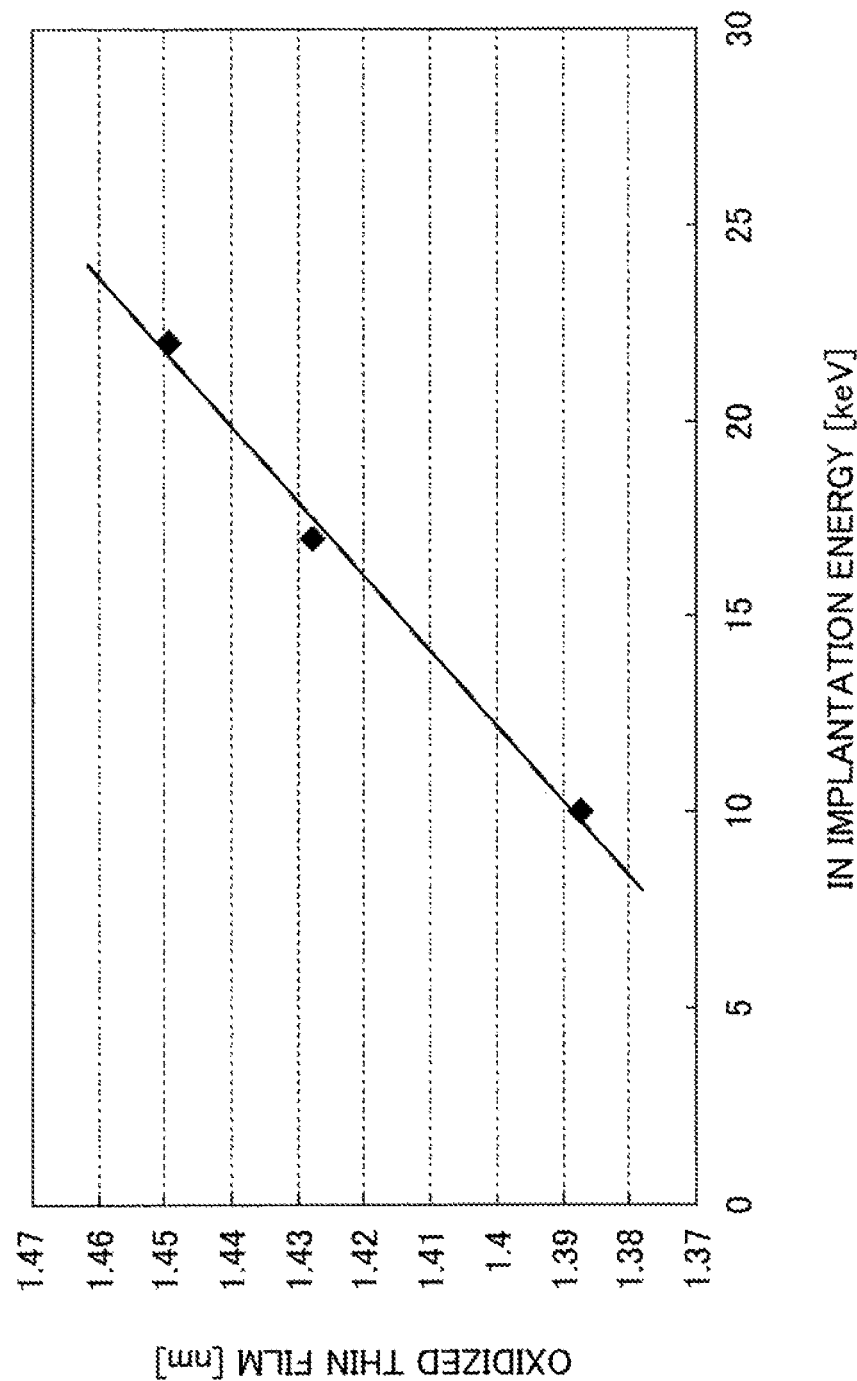
FIG. 6 is a graph illustrating a relationship between In implantation energy and an obtained oxide film thicknesses.

Further, as illustrated in FIG. 6, it is found that In near the front surface of the semiconductor substrate suppresses oxidation and forms oxide films having a thickness smaller than a desired film thickness. FIG. 6 illustrates oxide film thicknesses obtained in an In-implanted substrate where $O_2$ and $H_2$ are supplied to a lamp annealing unit and wet oxidation is applied on the condition that oxide films having a thickness of 2 nm are formed on the substrate into which no In is implanted. When In is implanted using implantation energy as a parameter, about a 2.01 nm film thickness of the substrate into which no In is implanted is reduced with the reduction of the implantation energy of In. Specifically, only about a 1.39 nm film thickness is obtained at an acceleration voltage of 10 keV. As evident from this results, it is found that the clustered In near the front surface of the semiconductor substrate thins the gate oxide films locally and degrades the reliability of the gate insulation films.

Conversely, as illustrated in FIGS. 7A-1 and 7A-2 through 7C-1 and 7C-2, with the addition of the pre-annealing (step S60 in FIG. 2) under an non-oxidizing atmosphere before forming the gate insulation films 5 in the In-implanted regions, the In clusters 2c near the front surface of the semiconductor substrate 1 can be separated or the In 2 or the clusters 2c can be exercised. Accordingly, taking the In into the gate insulation films (of the NMOS transistors of the core part) in the In-implanted regions and/or locally suppressing the growth of the gate oxide films 5 due to the clusters 2c are/is prevented, thereby suppressing or inhibiting the degradation of the reliability of the gate insulation films 5. In this sense, the above pre-annealing may also be called recovery annealing. Note that the pre-annealing (recovery annealing) may be performed after the gate oxide films 3 of the other transistor are separated as illustrated in FIG. 7B-2 or may be performed before the gate oxide films 3 are separated as illustrated in FIG. 7A-1.

Next, temperature profiles in which the recovery annealing is suitable are described. It is presumed that the clusters of In, which may degrade the reliability of the gate insulation films in the In-implanted regions, occur in the temperature falling process of the heat treatment. In order to form the gate oxide films, a batch-type vertical diffusion furnace increases a temperature of about 5° C. per minute and decreases a temperature of about 3° C. per minute. Even with a unit capable of increasing and decreasing a temperature at high speed controls the temperature in the range of 50 through 100° C. at maximum.

The recovery annealing is preferably performed at a temperature of 1000° C. or higher so as to, for example, efficiently separate clustered In. The upper limit of the temperature may be 1100° C. within a range less than or equal to the limit (for example, 1200° C.) of the unit in consideration of, for example, the warpage of the wafer. Further, in order to avoid clustering In again, it is preferable to increase a temperature falling rate, particularly, at the ramp-down time up to, for example, 20° C. per second or higher. Therefore, it is preferable to use a rapid temperature rising/falling annealing unit using flash lamp annealing or laser annealing.

For example, the flash lamp annealing unit can control a temperature (in the range of about 500 through 1200° C.), annealing time (in the range of zero through several hundred seconds), and a temperature rising/falling rate in response to a desired process request. Generally, the flash lamp annealing unit is capable of achieving a temperature rising/falling rate of 20° C. per second or higher, and a temperature rising/falling rate of about 200° C. per second depending on the amount of voltage applied.

Figure 8:
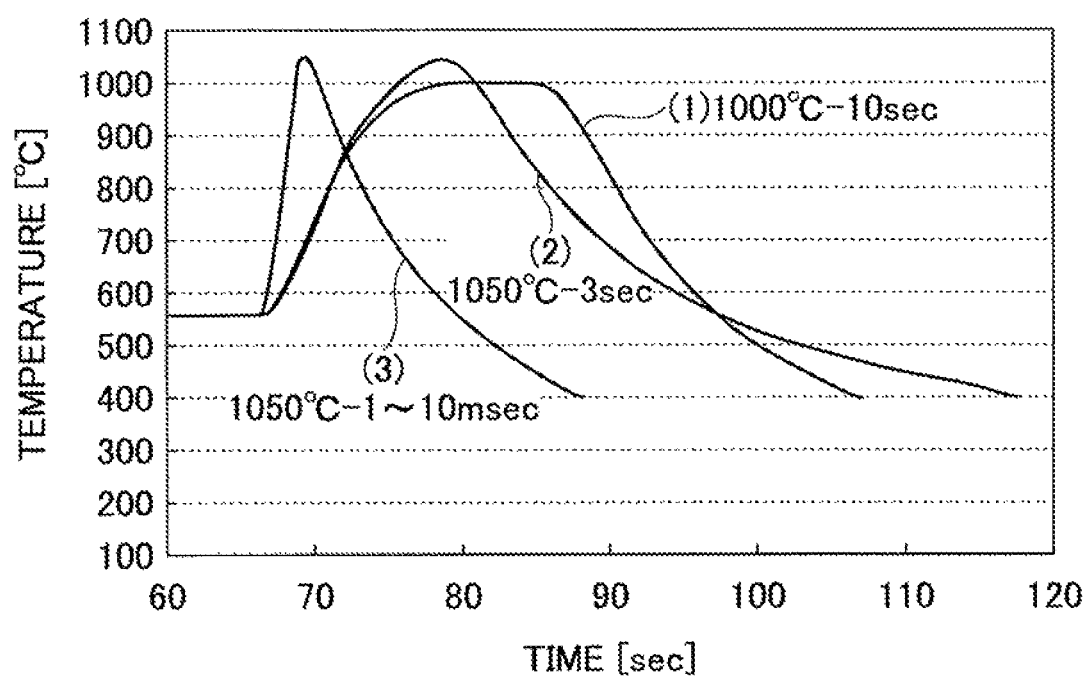
FIG. 8 is a graph illustrating an example of temperature profiles in which pre-annealing/recovery annealing is suitable.

FIG. 8 illustrates an example of temperature profiles by lamp annealing used for the recovery annealing. The three examples of plotted temperature history are obtained by performing the annealing (1) at 1000° C. for 10 seconds, (2) at 1050° C. for 3 seconds, and (3) at 1050° C. for 1 through 10 milliseconds after temporarily stabilizing and uniformizing the in-plane temperature of the wafer at 550° C. The temperature rising rates and the temperature falling rates are made different depending on temperatures or temperature ranges where they are defined. Here, the temperature rising rates are averages from a temperature rising start point at 550° C. to target temperature arrival points, and the temperature falling rates are averages from the target temperature falling start points to the arrival point at 550° C. The temperature rising rates and the temperature falling rates are (1) 43° C. per second and 37° C. per second, (2) 43° C. per second and 26° C. per second, and (3) 145° C. per second and 45° C. per second, respectively. Depending on the temperature history of the heating process performed until the execution of the recovery annealing since the In implantation, the reliability degradation of the gate insulation films in the In-implanted regions may be suppressed by the annealing in a shorter period of time like (3) in which the annealing is performed at 1050° C. for 1 through 10 milliseconds.

Next, an example of the method for manufacturing the semiconductor device according to the first embodiment is described with reference to FIGS. 9A, 9B, and 9C through FIGS. 18A and 18B. In this example, the NMOS transistors and PMOS transistors operating at 1.0 V and the NMOS transistors and PMOS transistors operating at 1.8 V and the NMOS transistors and PMOS transistors operating at 3.3 V of the I/O part are formed on a single Si substrate. Note that the arrangement of these transistors illustrated in the figures is used only for description purposes.

Figure 9A:
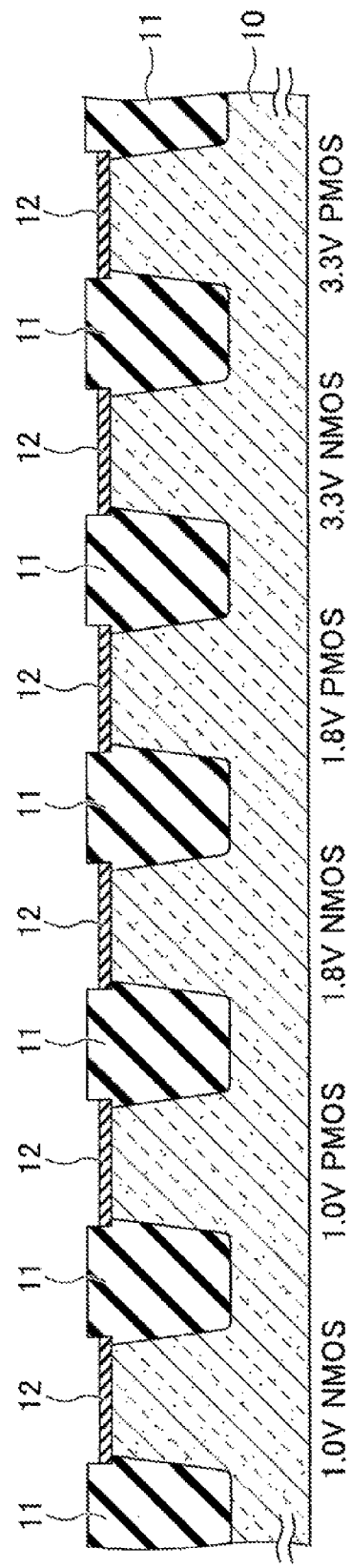

First, element isolation insulation films 11 serving as, for example, the STI for electrically isolating the various transistors are formed on a semiconductor substrate 10 (FIG. 9A). In order to form the STI, after $SiO_2$ films having a thickness of about 10 nm are, for example, formed on the Si substrate 10 and $Si_3N_4$ films having a thickness of about 100 nm are deposited on it, shallow trenches having a depth of about 400 nm are formed by a dry etching method. Then, after the $SiO_2$ films are deposited to fill in the trenches and flattening is performed by a CMP (Chemical Mechanical Polishing) method, the $Si_3N_4$ films are removed. Thus, an isolation structure is obtained in which the flat oxide films are filled. $SiO_2$ films 12 having a thickness of about 10 nm are formed that serve as through oxide films at subsequent well implantation and channel implantation.

Figure 9B:
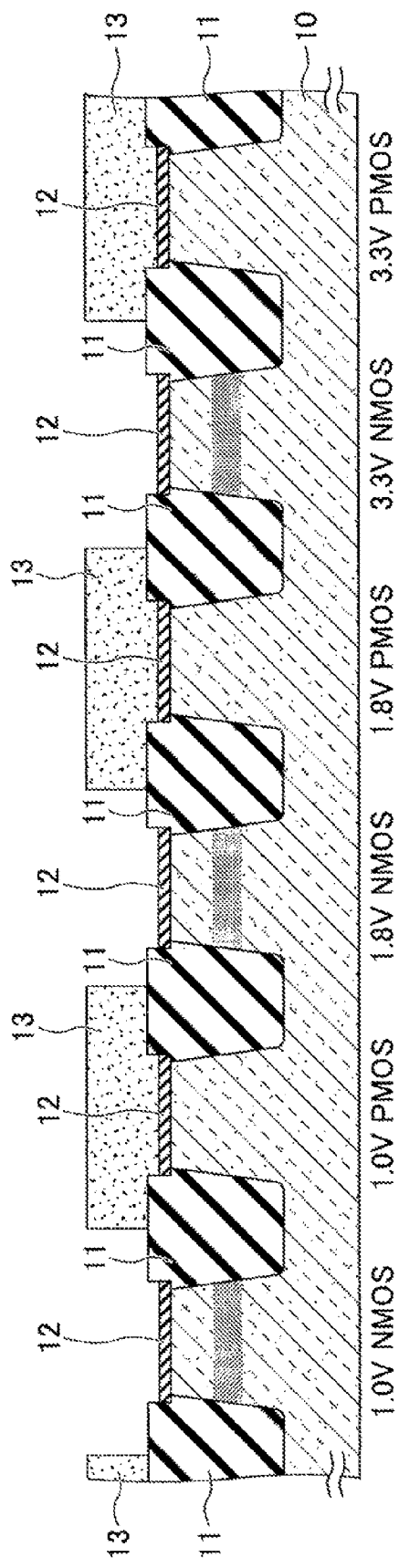

Next, resists 13 patterned to expose the forming regions of respective NMOS transistors are formed, and ion-implantation for forming p-wells is performed (FIG. 9B). For example, B is implanted at an acceleration voltage of 50 through 120 keV and a dose of $3 \times 10^{13}$ $cm^{-2}$ (3)E13; hereinafter a dose is indicated in the same manner). Then, the resists 13 are separated by chemical solution treatment using, for example, a sulfuric acid and a hydrogen peroxide solution. For handling particles, chemical solution treatment using an ammonia/hydrogen peroxide solution may be added.

Next, resists 14 patterned to expose the forming regions of respective PMOS transistors are formed, and ion-implantation for forming n-wells is performed (FIG. 9C). For example, P is implanted at an acceleration voltage of 300 through 360 keV and a dose of about 3E13. Then, like the resists 13 described above, the resists 14 are separated.

Next, channel implantation for controlling a threshold voltage Vth is performed in the forming regions of the respective transistors. Note that channel stop implantation may be performed in regions deeper than the channel implantation regions in consideration of punch through. Here, the channel implantation illustrated in the figures is performed using the NMOS and PMOS transistors operating at the respective voltages as one group. However, in a case where there are transistors constituting an SRAM and transistors having different target values of Vth inside the core operating at 1.0 V, the implantation may be performed for each of segmented groups. Furthermore, the order of six channel implantation processes described below may be appropriately changed.

As an example, resist patterns 21 are formed to expose the forming regions of the 3.3 V NMOS transistors, and B is, for example, implanted at an acceleration voltage of 10 through 30 keV and a dose of about 1E12 through 3E13 (FIG. 10A). Resist patterns 22 are formed to expose the forming regions of the 3.3 V PMOS transistors, and As is, for example, implanted at an acceleration voltage of 60 through 100 keV and a dose of about 1E12 through 3E13 (FIG. 10B). Resist patterns 23 are formed to expose the forming regions of the 1.8 V NMOS transistors, and B is, for example, implanted at an acceleration voltage of 10 through 30 keV and a dose of about 1E12 through 3E13 (FIG. 10C). Resist patterns 24 are formed to expose the forming regions of the 1.8 V PMOS transistors, and As is, for example, implanted at an acceleration voltage of 60 through 100 keV and a dose of about 1E12 through 3E13 (FIG. 11A).

Then, resist patterns 25 are formed to expose the forming regions of the 1.0 V NMOS transistors, and In-implantation including In is performed (FIG. 11B). For example, In is implanted at an acceleration voltage of 40 through 120 keV and a dose of about 4E12 through 2E13. Further, B may be additionally implanted at an acceleration voltage of 10 through 20 keV and a dose of about 1E12 through 5E13. Finally, resist patterns 26 are formed to expose the forming regions of the 1.0 V PMOS transistors, and As is, for example, implanted at an acceleration voltage of 60 through 100 keV and a dose of about 1E12 through 5E13 (FIG. 11C).

Next, the heat treatment is performed to activate impurities implanted by the well implantation and the channel implantation (FIG. 12A). The heat treatment recovers the crystal defects of the Si substrate 10 caused by the implantations, thereby preventing accelerated oxidation or the like in a subsequent gate oxide film forming process and easily obtaining a desired film thickness. For example, rapid temperature rising/falling annealing may be performed at about 1000° C. for about 10 seconds under an $N_2$ atmosphere. Further, the annealing may be performed at a lower temperature such as 800° C. for 30 seconds.

Figure 12B:
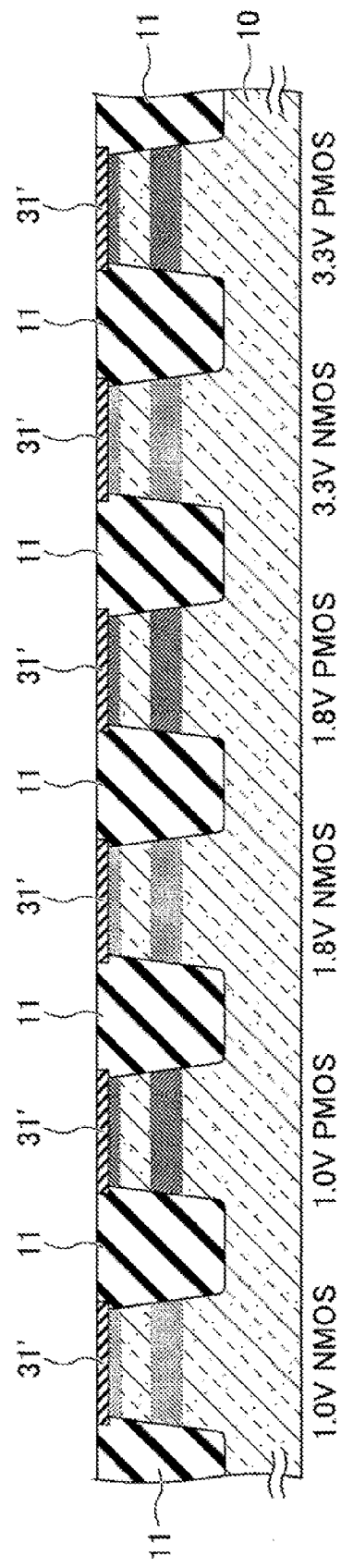

Then, the through oxide films 12 used for the channel implantation and the like are removed by a HF to expose the surface of the Si substrate in the forming regions of the elements. Thus, oxide films 31' having a thickness of about 5 through 7 nm are formed (FIG. 12B). For example, water-vapor or dry oxygen oxidation is performed at about 800° C. in a vertical oxidation furnace. Alternatively, heat oxidation treatment is performed at 900° C. or higher under an oxygen atmosphere or an oxygen/hydrogen mixed atmosphere in a rapid temperature rising/falling annealing unit.

Figure 12C:
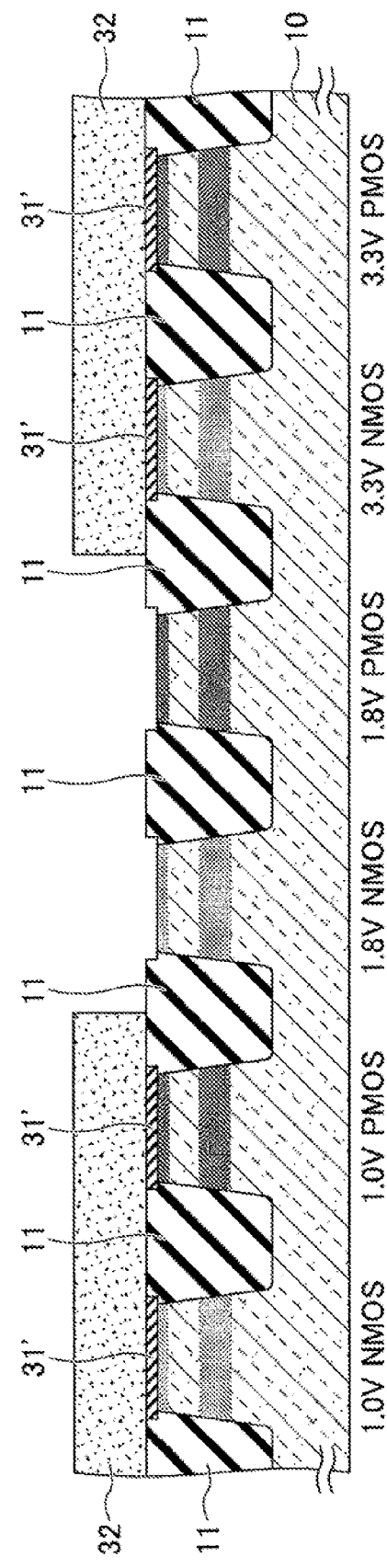
Figure 13A:
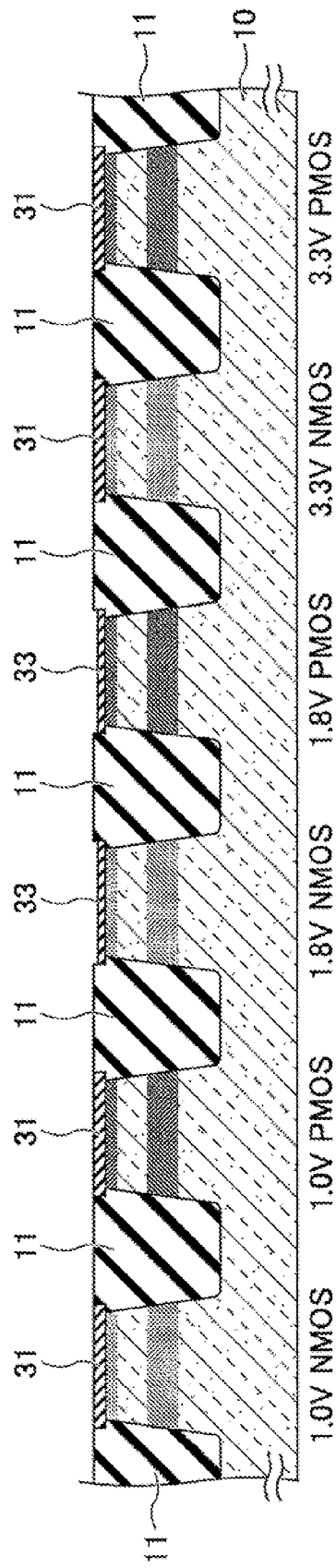

Next, resist patterns 32 are formed to expose the forming regions of the 1.8 V MOS transistors, and the oxide films 31 on the regions are etched by, for example, an HF (FIG. 12C). After removing the resists 32, oxide films 33 having a thickness of about 2.8 through 3.5 nm are formed with respect to the 1.8 V MOS transistors (FIG. 13A). For example, water-vapor is performed at about 750 through 800° C. in a vertical oxidation furnace. Alternatively, heat oxidation treatment is performed at 800° C. or higher under an oxygen atmosphere or an oxygen/hydrogen mixed atmosphere in a rapid temperature rising/falling annealing unit. At this time, the oxide films 31' having a thickness of 5 through 7 nm formed in the process of FIG. 12B are also subjected to this oxidation treatment to be formed into the oxidation films 31 whose film thickness is made increase by about 1 nm. The increased oxide films 31 become the gate insulation films of the 3.3 V MOS transistors.

Figure 13B:
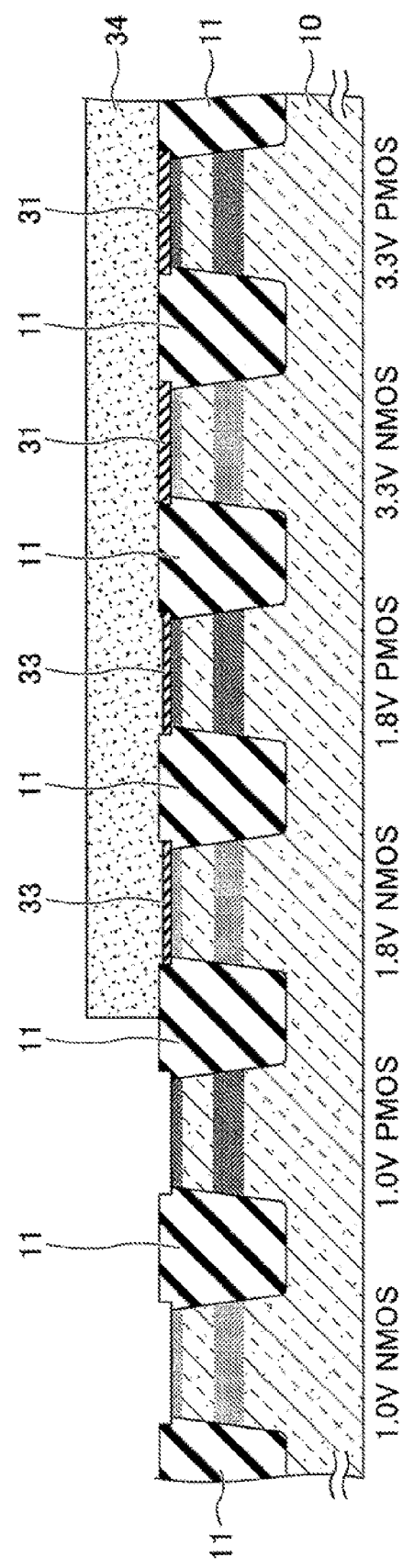

Then, resist patterns 34 are formed to expose the forming regions of the 1.0 V MOS transistors, and the oxide films 31 on the regions are etched by, for example, an HF (FIG. 13B).

Next, after removing the resists 34, as described above in step S60 of FIG. 2, the heat treatment (the pre-annealing/recovery annealing) is performed prior to forming the gate insulation films of the 1.0 V MOS transistors at preferably 1000 through 1100° C. under an non-oxidizing atmosphere (FIG. 13C). For example, the heat treatment is performed at about 1000° C. for about 10 seconds or at about 1050° C. for about three seconds in a rapid temperature rising/falling annealing unit. The non-oxidizing atmosphere may be an atmosphere such as an $N_2$, $H_2$, He, or Ar atmosphere or a mixed atmosphere of these substances.

As a modified example, the recovery annealing may be performed between the process of FIG. 13A and the process of FIG. 13B. That is, the recovery annealing may be performed in a state in which the oxide films 31 remain on the forming regions of the 1.0 V MOS transistors.

As another modified example, the recovery annealing may be performed between the process of FIG. 13A and the process of FIG. 13B, and the heat treatment may be performed in the process of FIG. 13C for the purpose of flattening the substrate and/or removing chemical oxide by reduction.

Then, gate insulation films 35 of the 1.0 V MOS transistors are formed (FIG. 14A). For example, base oxide films having a thickness of about 1.0 through 1.2 nm are formed under an $O_2$ atmosphere or a pressure-reduced $O_2$ atmosphere in a rapid temperature rising/falling processing unit and subjected to nitriding treatment. In nitriding the base oxide films, front layers are nitrided by a plasma nitriding method and subjected to post-annealing under an non-oxidizing atmosphere such as an $O_2$, $N_2O$, or NO atmosphere (including an atmosphere of these substances diluted by $N_2$ or the like). Finally, the annealing may be additionally performed under an inert gas atmosphere such as an $N_2$ atmosphere. Further, so-called high-k materials may be deposited instead of the gate insulation films of an oxynitride film system after forming the base oxide films.

Next, processes after forming the gate electrodes are performed. Note that in the cross-sectional views of the following processes, the wells and the channel regions or their dopants are not illustrated in the figures for clarification purposes. Further, the following processes are merely examples, and this embodiment is not limited to the aspect described below.

First, a gate electrode material 41 is deposited (FIG. 14B). For example, polysilicon having a thickness of about 90 through 150 nm is deposited at 600° C. Next, the gate electrode material 41 and the insulation films 31, 33, and 35 beneath the gate electrode material 41 are patterned to form the gate electrodes 41 and the gate insulation films 31, 33, and 35 of the respective transistors (FIG. 14C).

Then, the source/drain extension regions of the respective transistors, i.e., LDD regions 51 are sequentially formed (FIG. 15A). For example, first, resists 52 are patterned to expose the forming regions of the 3.3 V NMOS transistors, and the ion-implantation is performed (FIG. 15A). Then, the same process is repeatedly performed. That is, the ion-implantation is performed to sequentially form the LDD regions 51 in the respective regions of the 3.3 V PMOS transistors, the 1.8 V NMOS transistors, the 1.8 V PMOS transistors, the 1.0 V NMOS transistors, and the 1.0 V PMOS transistors (FIG. 15B). After these ion-implantations, the activation annealing may be performed by, for example, spike annealing at about 1025° C.

Next, an insulation film 53 for forming side walls is deposited (FIG. 15C). For example, a nitride film, an oxide film, or the like having a thickness of about 7 through 70 nm is deposited by a CVD (Chemical Vapor Deposition) method. A processing temperature under the CVD method is generally about 700° C. However, a low temperature process at 600° C. or lower may be performed because the LDD regions are formed. Then, the deposited film 53 is anisotropically etched by, for example, a dry etching method to form the side walls 54 at the side walls of the gate electrodes (FIG. 16A).

Next, resist patterns 55 are formed to expose the forming regions of the respective PMOS transistors, and an impurity is implanted into source/drain regions 56 and the gate electrodes 41 (FIG. 16B). For example, B is implanted at an acceleration voltage of 2 through 5 keV and a dose of about 4E15 through 1E16. Similarly, resist patterns 57 are formed to expose the forming regions of the respective NMOS transistors, and an impurity is implanted into the source/drain regions 56 and the gate electrodes 41 (FIG. 16C). For example, P is implanted at an acceleration voltage of 6 through 10 keV and a dose of about 4E15 through 2E16.

Subsequently, the annealing is performed for activation. Generally, in order to form USJ (Ultra Shallow Junction), the activation annealing at high temperature for a short period of time is required. For example, rapid temperature rising/falling annealing called spike annealing is performed at a temperature of about 1000 through 1050° C. The spike annealing generally includes the heat treatment for every second. However, the activation may be achieved in a shorter period of time, for example, on a millisecond order using flash annealing, laser annealing, or the like. Further, these annealing methods may be combined together.

Then, the front layers of the gate electrodes 41 and the source/drain regions 56 are silicified to reduce contact resistances as occasion demands (FIG. 17A). For example, silicide layers 58 made of cobalt silicide, nickel silicide, or the like may be formed.

Next, an insulation film 61 or the like, such as a nitride film and an oxide film, serving as a first interlayer film is formed (FIG. 17B). In a case where the silicide layers 58 are formed in the process of FIG. 17A, a low temperature process is preferably performed.

Figure 17C:
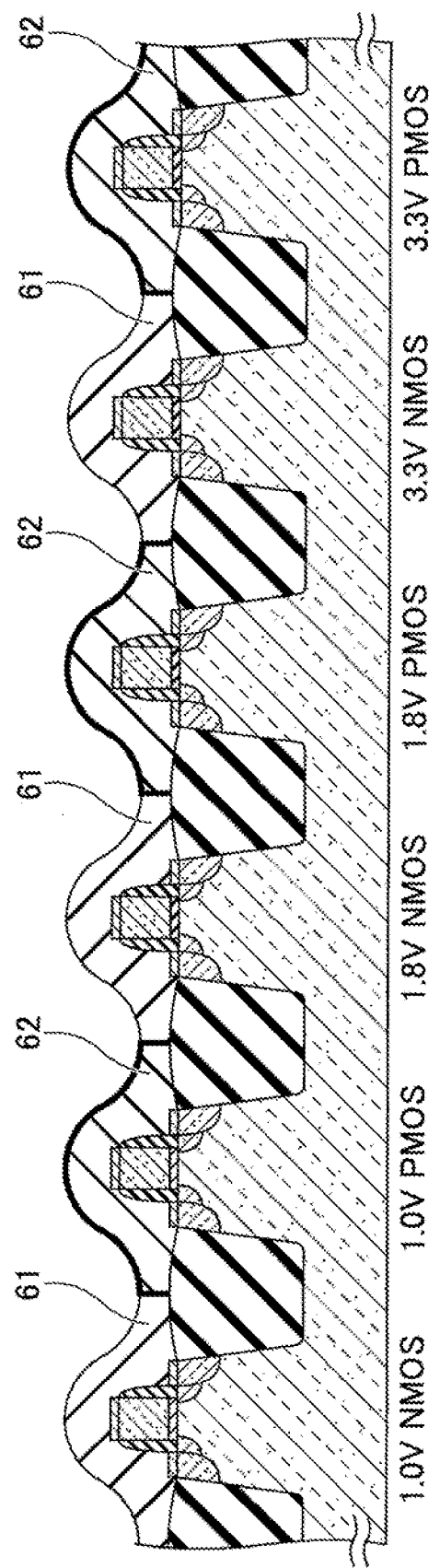

Further, in order to improve the electrical characteristics of the transistors, the first interlayer film may be used in many ways so as to generate tensile stress in the regions of the NMOS transistors and compression stress in the regions of the PMOS transistors. For example, in the process of FIG. 17B, the tensile insulation film 61 is deposited in advance. The insulation film 61 on the PMOS transistors is selectively removed by etching using a resist mask. After removing the resist mask, a compressive insulation film 62 is deposited. Then, the compressive insulation film 62 is selectively removed by etching using another resist mask. Thus, the NMOS transistors may be covered with the tensile insulation films 61, and the PMOS may be covered with the compressive insulation films 62 (FIG. 17C).

Figure 18A:
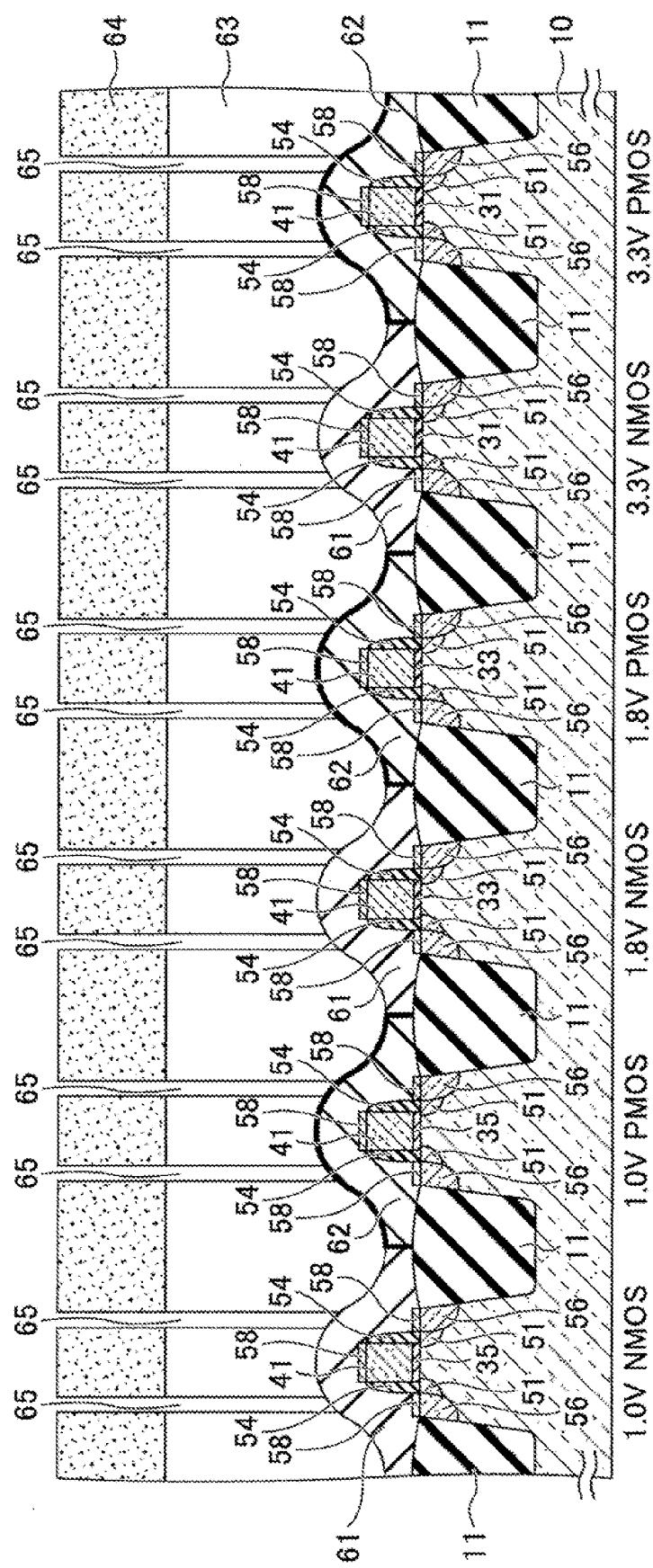

Next, an insulation film 63 serving as a second interlayer film is deposited and flattened by, for example, a CMP method. After this, contact holes passing through the second interlayer film 63 and the first interlayer film 61 or 62 are formed by etching using a resist mask (FIG. 18A).

Then, a wiring material fills in the contact holes 65, and the wiring material and the interlayer films protruding from the contact holes are flattened by, for example, a CMP method to form contact holes 66 (FIG. 18B). Subsequently, wiring processes corresponding to the number of layers required are performed to complete the semiconductor device.

(Second Embodiment)

Figure 19:
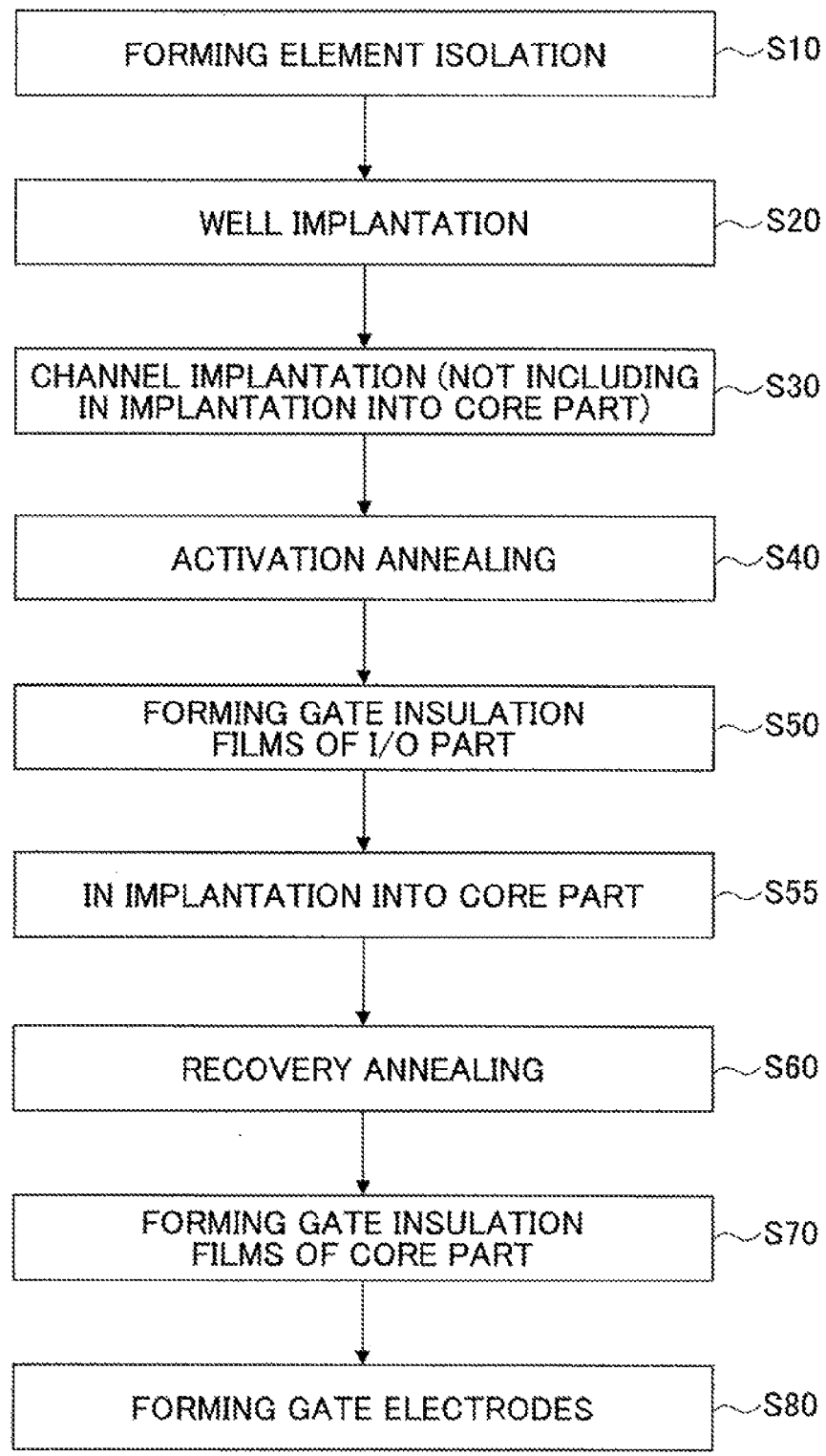
FIG. 19 is a flowchart illustrating a method for manufacturing a semiconductor device according to a second embodiment.

Next, a method for manufacturing a semiconductor device according to a second embodiment is described with reference to FIG. 19. This method has steps, most of which are common to the method according to the first embodiment described with reference to FIG. 2. Therefore, the steps common to the first embodiment are denoted by the same reference symbols in FIG. 2 and their detailed descriptions are omitted here.

This method has step S35 instead of step S30 of FIG. 2. In step S35, the channel-implantation for controlling a threshold voltage is performed with respect to the channel regions of the transistors. However, the In-implantation into the NMOS transistors of the core part is not performed in this step. For example, in step S35, only the channel-implantation into the transistors other than the NMOS transistors of the core part is performed. In a case where any dopant such as B other than In is implanted into the channel regions of the NMOS transistors of the core part, the implantation of ions other than In into the NMOS transistors of the core part may be performed in addition to the channel-implantation into the transistors other than the NMOS transistors of the core part.

The method according to the second embodiment further has step S55 in addition to the group of the steps in the method illustrated in FIG. 2. In step S55, the In-channel implantation into the NMOS transistors of the core part is performed. Further, in a case where the implantation of any dopant such as B other than In into the channel regions of the NMOS transistors of the core part is performed and if the implantation is not performed in step S35, such a dopant may be implanted in addition to In. In the ion-implantation in step S55, the gate insulation films of the other transistors formed on the core part in step S50 may be used as through oxide films.

After step S33, the method according to the second embodiment has a recovery annealing step S60 equivalent to step S60 of the method illustrated in FIG. 2. Further, in step S60 of FIG. 19, for example, heat treatment similar to the heat treatment in step S60 of FIG. 2 described in detail in association with FIGS. 7A-1 and 7A-2 through 7C-1 and 7C-2, such as rapid temperature rising/falling recovery annealing at about 1000° C. for about 10 seconds under an $N_2$ or $H_2$ atmosphere, may be performed. However, since the In-channel implantation into the NMOS transistors of the core part is performed in step S55, i.e., performed after forming the gate insulation films of the other transistors (S50), the gate insulation films of the NMOS transistors of the core part can be formed without subjecting the oxidation process to the implanted In. The recovery annealing according to the second embodiment tends to exercise or separate the precipitated or clustered In with the heat treatment. Therefore, it can be said that the recovery annealing strongly recovers damages caused by the In-implantation.

Also in the second embodiment, the recovery annealing is performed prior to forming the gate insulation films of the NMOS transistors of the core part in step S70. Accordingly, an improvement in the roll-off characteristics with the In-channel implantation can be achieved while ensuring the reliability of the gate insulation films of the In-implanted regions.

Further, an example of the method for manufacturing the semiconductor device according to the second embodiment can include one obtained by slightly modifying the example of FIGS. 9A, 9B, and 9C through 18A, 18B, and 18C describing the first embodiment.

In the second embodiment, in connection with step S35, the entire process of the channel implantation into the 1.0 V NMOS transistors in FIG. 11B or the In implantation of the implantation process is omitted.

Figure 20:
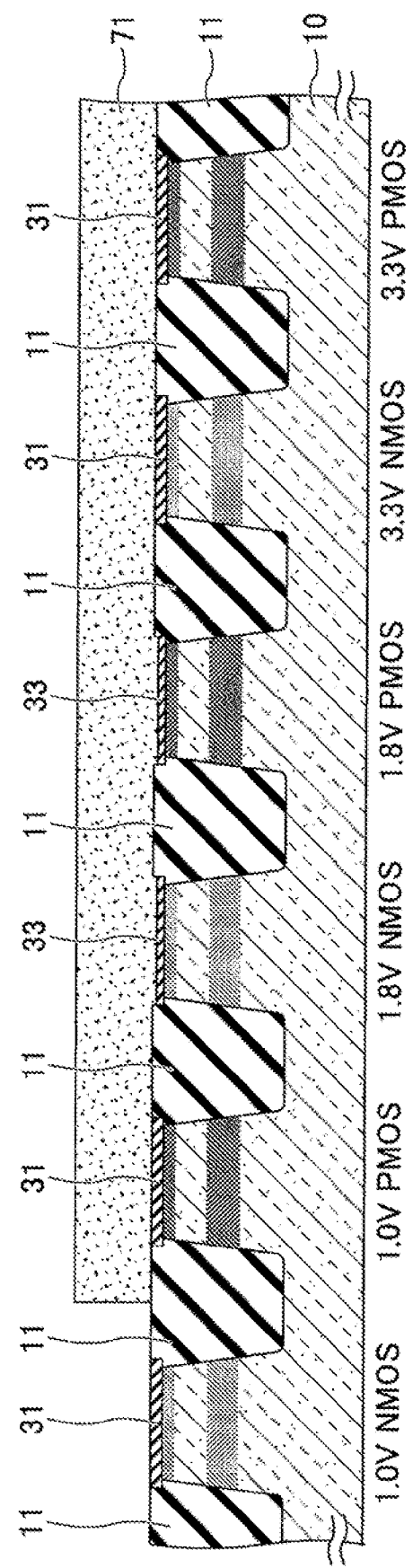
FIG. 20 is a cross-sectional view illustrating an example of the method for manufacturing the semiconductor device according to the second embodiment.

Further, in connection with step S55, the process of FIG. 20 is performed between the process of FIG. 13A and the process of FIG. 13B. In the process of FIG. 20, resists 71 patterned to expose the forming regions of the 1.0 V NMOS transistors are formed on the structure illustrated in FIG. 13A, and the In-channel implantation is performed with respect to the regions. For example, In is implanted at an acceleration voltage of 40 through 120 keV and a dose of about 4E12 through 2E13. Further, in a case where the entire process of the FIG. 11B is omitted, B may be additionally implanted at an acceleration voltage of 10 through 20 keV and a dose of about 1E12 through 5E13 as occasion demands. In these ion implantations, the oxide films 31 on the forming regions of the 1.0 V NMOS transistors may be used as through oxide films.

After the process of FIG. 20, the insulation films 31 on the forming regions of the 1.0 V MOS transistors are removed in the same manner as FIG. 13B, and the annealing for recovering damages caused by the In-implantation is performed in the same heating treatment as FIG. 13C. Then, the gate insulation films 35 of the 1.0 V MOS transistors are formed in the same manner as FIG. 14A, and the processes after the process of FIG. 14B are performed. Thus, the semiconductor device can be completed.

As a modified example, the recovery annealing included in the process of FIG. 13C may be performed between the added step of FIG. 20 and the step of FIG. 13B. That is, the recovery annealing may be performed in a state where the oxide films 31 remain on the forming regions of the 1.0 V MOS transistors.

As another modified example, the recovery annealing may be performed between the process of FIG. 20 and the process of FIG. 13B, and the heat treatment may be performed in the process of FIG. 13C for the purpose of flattening the substrate and/or removing chemical oxide by reduction.

Although the embodiments are described above, the present invention is not limited to the specifically disclosed embodiments, and variations and modifications may be made without departing from the scope of the present invention. As heavy element impurities having a smaller diffusion coefficient and a larger atomic number than B, Ga, Sb, Bi, Ge, and the like other than In exist. In the embodiments of the present invention, these elements are effective for ensuring the reliability of the gate insulation films of the core part as well as In. Further, regarding the PMOS transistors, Sb, Bi, and the like exist as heavy element impurities having a smaller diffusion coefficient and a larger atomic number than generally-used P, As, or the like. Furthermore, elements such as Xe, Ar, and Kr may be implanted for controlling the channels although they do not directly serve as p-type or n-type impurities.

All examples and conditional language recited herein are intended for pedagogical purposes to aid the reader in understanding the present invention and the concepts contributed by the inventor to furthering the art, and are to be construed as being without limitation to such specifically recited examples and conditions, and the organization of such examples in the specification does not relate to a showing of the superiority or inferiority of the present invention. Although the embodiment of the present invention has been described in detail, it should be understood that the various changes, substitutions, and alterations could be made hereto without departing from the spirit and scope of the present invention.

What is claimed is:

1. A manufacturing method of a semiconductor device, comprising:
    implanting indium into a first region of a semiconductor substrate;
    forming a first gate insulation film having a first film thickness on the semiconductor substrate in the first region and a second region different from the first region after the implanting;
    removing the first gate insulation film from the first region with a part of the first gate insulation film located in the second region being left;
    annealing the semiconductor substrate at a temperature of 1000° C. or higher after forming the first gate insulation film;
    forming a second gate insulation film having a second film thickness on the first region after said annealing;
    forming a first gate electrode on the second gate insulation film in the first region;

forming a first source/drain region in the first region of the semiconductor substrate by implanting an n-type impurity into the first region of the semiconductor substrate after said forming the first gate electrode; and activating the indium by heat treatment after said implanting and before said forming the first gate insulation film, wherein a temperature falling rate of said annealing is 20° C. per second or higher.

2. The manufacturing method of the semiconductor device according to claim 1, wherein the said annealing is performed under a non-oxidizing atmosphere.

3. The manufacturing method of the semiconductor device according to claim 1, wherein said annealing anneals the semiconductor substrate at a temperature of 1000° C. or higher and 1100° C. or lower.

4. The manufacturing method of the semiconductor device according to claim 1, wherein said annealing anneals the semiconductor substrate by flash lamp annealing or laser annealing.

5. The manufacturing method of the semiconductor device according to claim 1, wherein the second film thickness is smaller than the first film thickness.

6. The manufacturing method of the semiconductor device according to claim 2, wherein the non-oxidizing atmosphere is a hydrogen atmosphere or a nitrogen atmosphere.

7. The manufacturing method of the semiconductor device according to claim 1, wherein said annealing is performed after removing the first gate insulation film from the first region.

8. The manufacturing method of the semiconductor device according to claim 1, wherein said annealing is performed before removing the first gate insulation film from the first region.

9. The manufacturing method of the semiconductor device according to claim 1, wherein the second film thickness is larger than the first film thickness.

10. The manufacturing method of the semiconductor device according to claim 1, wherein in removing the first gate insulation film, whole of the first gate insulation film located in the first region is removed.

* * * * *